United States Patent [19]
Berlekamp et al.

[11] Patent Number: 5,271,021
[45] Date of Patent: Dec. 14, 1993

[54] DIGITAL OPTICAL SOUND SYSTEM

[75] Inventors: Elwyn R. Berlekamp, Piedmont; Lloyd R. Welch, La Canada, both of Calif.

[73] Assignee: Cyclotomics, Incorporated, Berkeley, Calif.

[21] Appl. No.: 807,285

[22] Filed: Dec. 13, 1991

Related U.S. Application Data
[63] Continuation of Ser. No. 415,020, Sep. 29, 1989, abandoned.

[51] Int. Cl.$^5$ .............................................. H03M 13/00
[52] U.S. Cl. ..................................... 371/37.1; 371/42; 371/61
[58] Field of Search ........................... 371/37.1, 42, 61

[56] References Cited
U.S. PATENT DOCUMENTS
4,633,470  12/1986  Welch et al. ..................... 371/37.1

Primary Examiner—Stephen M. Baker
Attorney, Agent, or Firm—Stephen C. Kaufman

[57] ABSTRACT

Estimates of the horizontal and vertical positions of digital bits on film are corrected by tracking the bit transition boundaries in the horizontal and vertical directions. Frequency of useful film bit transitions in the vertical direction is maximized prior to recording by error correction encoding the digital audio bytes using a symmetrical generator polynomial and then selectively inverting symmetric portions of each codeword. Frequency of useful film bit transistions in the horizontal direction is maximized prior to recording by channel encoding the error correction symbols in each codeword so as to force the weight of the resulting symbol to be half the number of data bits per symbol.

2 Claims, 20 Drawing Sheets

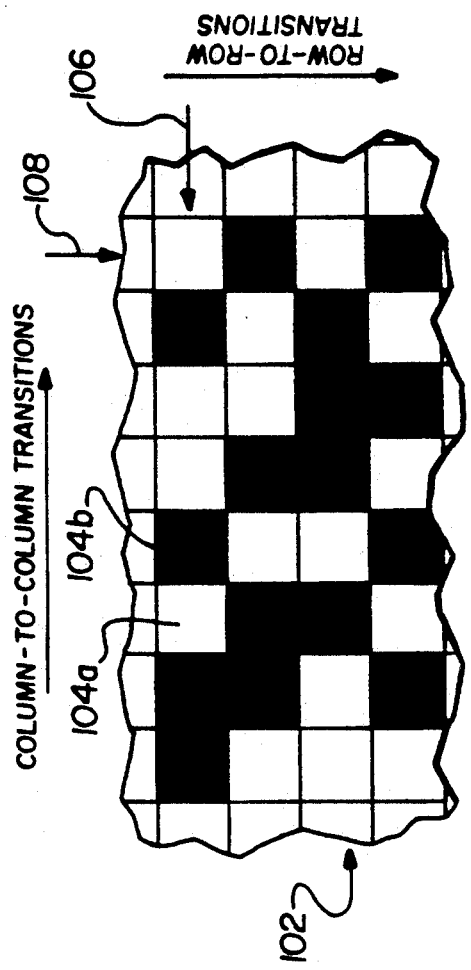
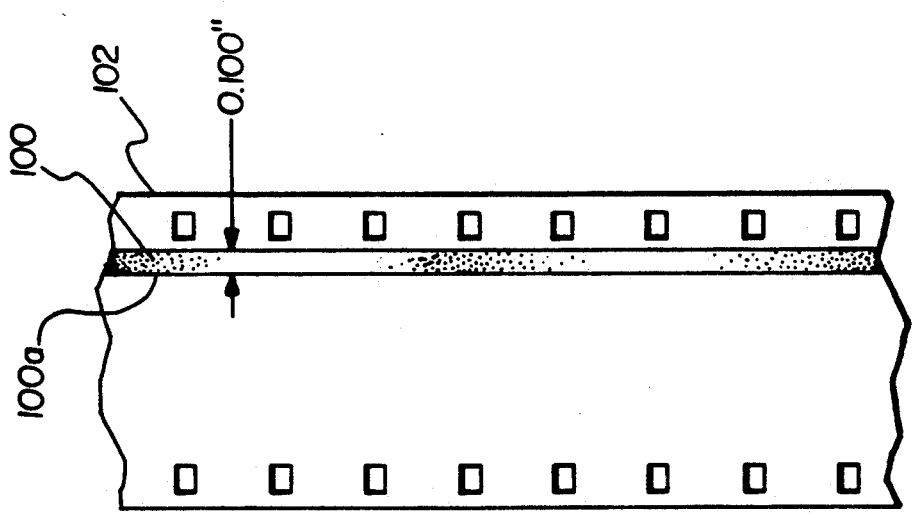
FIG. 1b
FIG. 1a

| 6-CODE HEX | 6-CODE BINARY | 8-CODE HEX | 8-CODE BINARY | 6-CODE HEX | 6-CODE BINARY | 8-CODE HEX | 8-CODE BINARY |
|---|---|---|---|---|---|---|---|
| 00 | 000000 | 17 | 00010111 | 20 | 100000 | 8B | 10001011 |
| 01 | 000001 | 1B | 00011011 | 21 | 100001 | 8D | 10001101 |
| 02 | 000010 | 1D | 00011101 | 22 | 100010 | 8E | 10001110 |
| 03 | 000011 | 27 | 00100111 | 23 | 100011 | 93 | 10010011 |
| 04 | 000100 | 2B | 00101011 | 24 | 100100 | 95 | 10010101 |
| 05 | 000101 | 2D | 00101101 | 25 | 100101 | 96 | 10010110 |
| 06 | 000110 | 2E | 00101110 | 26 | 100110 | 99 | 10011001 |
| 07 | 000111 | 33 | 00110011 | 27 | 100111 | 9A | 10011010 |
| 08 | 001000 | 35 | 00110101 | 28 | 101000 | 9C | 10011100 |
| 09 | 001001 | 36 | 00110110 | 29 | 101001 | A3 | 10100011 |
| 0A | 001010 | 39 | 00111001 | 2A | 101010 | A5 | 10100101 |
| 0B | 001011 | 3A | 00111010 | 2B | 101011 | A6 | 10100110 |
| 0C | 001100 | 3C | 00111100 | 2C | 101100 | A9 | 10101001 |
| 0D | 001101 | 47 | 01000111 | 2D | 101101 | AA | 10101010 |
| 0E | 001110 | 4B | 01001011 | 2E | 101110 | AC | 10101100 |
| 0F | 001111 | 4D | 01001101 | 2F | 101111 | B1 | 10110001 |
| 10 | 010000 | 4E | 01001110 | 30 | 110000 | B2 | 10110010 |
| 11 | 010001 | 53 | 01010011 | 31 | 110001 | B4 | 10110100 |
| 12 | 010010 | 55 | 01010101 | 32 | 110010 | B8 | 10111000 |
| 13 | 010011 | 56 | 01010110 | 33 | 110011 | C3 | 11000011 |
| 14 | 010100 | 59 | 01011001 | 34 | 110100 | C5 | 11000101 |
| 15 | 010101 | 5A | 01011010 | 35 | 110101 | C6 | 11000110 |
| 16 | 010110 | 5C | 01011100 | 36 | 110110 | C9 | 11001001 |
| 17 | 010111 | 63 | 01100011 | 37 | 110111 | CA | 11001010 |
| 18 | 011000 | 65 | 01100101 | 38 | 111000 | CC | 11001100 |
| 19 | 011001 | 66 | 01100110 | 39 | 111001 | D1 | 11010001 |
| 1A | 011010 | 69 | 01101001 | 3A | 111010 | D2 | 11010010 |
| 1B | 011011 | 6A | 01101010 | 3B | 111011 | D4 | 11010100 |
| 1C | 011100 | 6C | 01101100 | 3C | 111100 | D8 | 11011000 |
| 1D | 011101 | 71 | 01110001 | 3D | 111101 | E2 | 11100010 |
| 1E | 011110 | 72 | 01110010 | 3E | 111110 | E4 | 11100100 |
| 1F | 011111 | 74 | 01110100 | 3F | 111111 | E8 | 11101000 |

FIG. 5

```
POSITION 0 0 0 0 0 0 0 0 0 1 1 1 1 1 1 1 1 1 2 2 2 2
1 2 3 4 5 6 7 8 9 0 1 2 3 4 5 6 7 8 9 0 1 2 3
FILM BYTES:
|————→ MESSAGE
ROW N                    ——ONE SYMBOL = 8 BIT BYTE (TYPICAL)
S  B C A  B C A  B C  A B C A B C A B C A B C A B
0  0 0 0  0 0 0  0 0  0 0 0 0 0 0 0 0 0 0 0 0 0 0
1  0 0 1  1 1 2  2 2  3 3 3 4 4 4 5 5 5 6 6 6 7 7
|————→ CURRENT BLOCK

ROW N+1
B C A B  C A B C A B C A B C A B C A B C A B C
0 0 0 0  0 0 0 0 0 1 1 1 1 1 1 1 1 1 1 1 1 1 1
6 6 7 7  7 8 8 8 9 9 9 0 0 0 1 1 1 2 2 2 3 3 3
|←REPEAT→|

ROW N+2   MESSAGE ←——|——→ CHECK
C A B C A B C A B C A  B C A B C A B C A B C A
1 1 1 1 1 1 1 1 1 1 1  1 1 1 1 1 1 1 1 1 1 1 2
2 3 3 3 4 4 4 5 5 5 6  6 6 7 7 7 8 8 8 9 9 9 0

ROW N+3         |——→ NEXT BLOCK
A B C A B C  S  S B C A B C A B C A B C A B C A
1 1 1 2 2 2     0 0 0 0 0 0 0 0 0 0 0 0 0 0 0 0
9 9 9 0 0 0  0  1 0 0 1 1 1 2 2 2 3 3 3 4 4 4 5
CURRENT BLOCK←——

ROW N+4
A B C A B C A B C A B C A B C A B C A B C A B
0 0 0 0 0 0 0 0 0 0 0 0 0 0 0 0 0 0 0 1 1 1 1
4 4 4 5 5 5 6 6 6 7 7 7 8 8 8 9 9 9 0 0 0 1 1

□ = ONE FILM BYTE (8 BITS)
```

DETERMINING ANGLES

ONLY VERY ELEMENTARY TESTS SUFFICE TO DETERMINE A(S,C) TO WITHIN AN ERROR OF ± 1/16.

IMPROVEMENT OF THE ERROR TO WITHIN ± 1/32 (APPROXIMATED TO ABOUT 2% OF 1/32) CAN BE DONE AS FOLLOWS:

DIGITAL OPTICAL SOUND SYSTEM

CROSS REFERENCE TO RELATED APPLICATION

This application is a continuation of application Ser. No. 07/415,020, filed on Sep. 29, 1989 by Berlekamp et al. now abandoned. The entire disclosure of this application is incorporated by reference herein. Each of these applications is copending and commonly assigned.

BACKGROUND OF THE INVENTION

The concept of providing digital sound with cinema film by photographically recording digital audio bits as optical pixels in a stripe along one edge of the film is well-known in the art, as disclosed in U.S. Pat. No. 4,600,280 to Clark. However, such an approach is fraught with perils, including the tendency of the cinema projector to run the film at an unsteady speed and to allow the film to wander laterally across the projector gate. The result is that significant portions of the digital audio bytes photographically recorded on the film are lost or corrupted during playback. This creates unacceptable and distracting noise during the showing of a movie, making the entire concept impractical for commercial use.

This problem was recognized in U.S. Pat. No. 4,839,733 to Karamon et al., in which a solution to the problem is proposed. Karamon et al. propose matching the digital sound track to a conventionally recorded sound track on another portion of the film. If a portion the digital sound track is clearly different from the presumably more reliable conventional sound track, then that portion is discarded and the conventional sound track is used to fill the resulting void. One disadvantage of this approach is that a problem with the digital sound track is not identified until it causes the digital sound track to be at least as bad if not worse in quality than the conventional sound track. Another disadvantage is that, once a problem is identified, the only solution is to temporarily switch to the lower quality conventional sound track, causing a noticeable loss of quality. In many uses, this would be unacceptable. Accordingly, the concept of digital optical sound continues to be mired by problems which at least threaten to make the concept impractical or unmarketable.

Accordingly, there is a great need for a digital optical sound system which automatically corrects for loss of digital audio data caused by movie projector speed fluctuations or by lateral film wander in the projector or by dirt or dust obsuring individual digital pixels on the film.

SUMMARY OF THE INVENTION

Estimates of the horizontal and vertical positions of optical bits on the film are corrected by tracking the bit transition boundaries in the horizontal and vertical directions. Frequency of useful film bit transitions in the vertical direction is maximized prior to recording by error correction encoding the digital audio bytes using a symmetrical generator polynomial and then selectively inverting symmetric portions of each codeword. Useful transitions are those in which the bits in alternate rows of the same column are different. Thus, the codeword inversion is performed by monitoring the number of such transistions for each possible inversion of the codeword, and then selecting that inversion having the greatest number of such transitions.

During playback, a row clock generator estimates the position of the transitions between horizontal rows of film bits by deciding whether the row clock leads or lags the actual timing of the horizontal film rows past the image sensor. It subtracts the average row luminance from the luminance of each pixel. The resulting differences are compared bit-by-bit with the corresponding differences obtained for the previous row. There are eight possible combinations for each such comparison, as each of the two compared values can be either positive or negative and can have a magnitude either greater or less than that of the other. Each combination is an unambiguous indication of either a lead or a lag condition of the row clock signal with respect to the actual occurence of row transitions at the image sensor. The results of the comparison address a programmable-read-only-memory (PROM) which maps the eight possible combinations to appropriate lead or lag conditions. The algebraic sum of all the lead and lag conditions across the entire row is computed. The modulus of a row clock counter is either decremented or incremented, depending upon whether the algebraic sum is positive or negative.

Frequency of useful film bit transitions in the horizontal direction is maximized prior to recording by channel encoding the error correction symbols in each codeword so as to force the weight of the resulting symbol to be half the number of data bits per symbol. In other words, the occurence of alternating zeroes and ones across a row of film bits is maximized. During playback, errors in the horizontal film bit position estimates are corrected by computing partial sums of sines and cosines of successive film bit positions across a horizontal row. This computation takes advantage of the period location of pixels across the linear image sensor viewing each film bit row. Based upon the determination thus made of the center of each film bit, a particular one or a weighted pair of the image sensor pixels is chosen as representative of the current film bit.

The magnitude of each film bit thus located is measured and compared to predetermined magnitudes representative of binary zero and one values. If the measured magnitude is not sufficiently close to either, then an erasure flag is transmitted along with the closest binary data value. The boundaries between received codeword symbols are determined in an electoral process in which the symbol weights of all possible boundaries are determined, with the boundary resulting in the symbol weight of the channel code being declared the winner. If this results in an indication that the current periodic set of symbol boundaries must be changed, the following steps are first taken before such a change is made. False indications of symbol boundary errors are eliminated by first attempting to achieve the requisite symbol weight by inverting those bits accompanied by an erasure flag. If such inversion succeeds, the symbols containing the inverted bits are flagged as erasures. Otherwise, a non-decode flag is transmitted along with the present codeword.

The error correction code performance is optimized by first attempting to decode each codeword while using the erasure flags as error locator symbols. If the decoder finds no error value symbols for certain ones of the erased symbol locations, then the symbols in those locations are used as valid symbols in a second decoding attempt by the decoder. In the second attempt, the useful number of erasure and errors is limited to a predetermined number significantly less than the maximum capacity of the decoder. If the number of erasures and corrections exceeds the predetermined number when the decoder begins its second pass, then a misdecode flag is transmitted. Presumably, however, the inversion of the erased bits results in fortuitously correct guess and therefore usually decreases the total number of erasures and errors below the predetermined number. This greatly enhances the reliability of the error correction decoder. By maintaining the admissible number of errors and erasures below the maximum number allowed by the code, the probability of a mis-decode (i.e., a decoded codeword which is apparently but not really correct) is minimized to an insignificant level.

DESCRIPTION OF THE DRAWINGS

The invention is best understood by reference to the accompanying drawings, of which:

FIGS. 1a and 1b a pictorial diagram of digital optical film bits photographically recorded on a strip of film;

FIG. 5 is a table illustrating the contents of a six-to-eight encoder PROM of the encoding system of FIG. 3;

FIG. 6 is a diagram illustrating the format of encoded data generated by the encoder system of FIG. 3;

FIG. 10 illustrates the juxtaposition of alternate rows for determining the number of useful film bit transitions in the encoded data;

DETAILED DESCRIPTION OF THE INVENTION

Problems to be Solved

Figure 2:
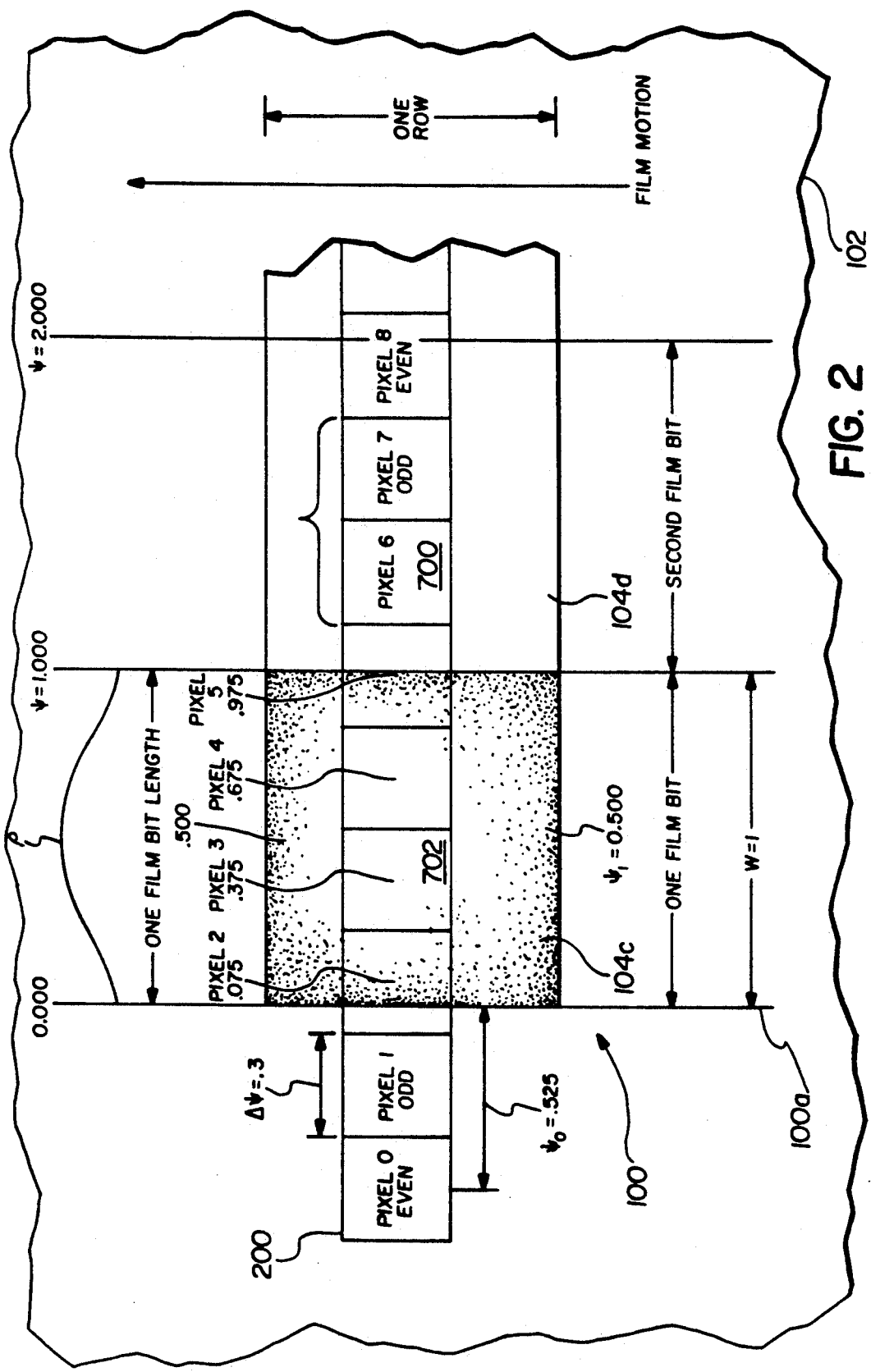
FIG. 2 is a pictorial diagram illustrating image sensor pixels overlying the film bits of FIG. 1.

Referring to FIG. 1, digital bits are photographically recorded in a "sound stripe" 100 along one edge of a strip of film 102 as individual black squares 104 organized into parallel horizontal rows 106 and parallel vertical columns 108. A square—or"film bit"—104a which is clear represents a binary "one" while a film bit 104b which is opaque represents a binary "zero", for example. Even though the film bits 104 may have been photographically recorded onto the film 102 with virtually perfect accuracy, the film bits 104 must be accurately "read" by a linear image sensor as the film is longitudinally transported in a projector. Unfortunately, such a projector transports the film 102 in a manner characterized by significant fluctuations in film transport speed. Such fluctuations distort the appearance of the row-to-row transitions between adjacent film bits within a column 108, making it difficult for the image sensor to maintain synchronization with the successive horizontal rows 106 presented to it as the film is transported. Moreover, such a projector allows the film 102 to wander laterally within its film gate and therefore with respect to the image sensor. Such lateral wandering distort the appearance of the column-to-column transitions between adjacent film bits within a row 106, making it difficult for the image sensor to distinguish among adjacent film bits within a row.

Referring to FIG. 2, an opaque film bit 104c lying along the inner edge 100a of the sound stripe 100 and an adjacent clear film bit 104d underlie a linear image sensor 200 extending across one complete horizontal row 106 of film bits 104. The linear image sensor 200 may be a charge coupled device (CCD) linear imaging array of individual pixels, for example, labelled pixel 1, pixel 2, pixel 3, etc., in FIG. 2. The density of the opaque film bit 106c falls off slightly near the edges of the film bit, as illustrated by the curve labelled "p". Therefore, the best representation of a film bit and of corresponding film bit transitions is given by the CCD pixel nearest the center of the film bit. Of course, as the film 102 laterally wanders with respect to the image sensor 200, the film bit center may wander under different CCD pixels.

One problem is how to always choose those CCD pixels nearest the centers of respective film bits in a given row despite lateral film wandering. Another problem is how to distinguish byte boundaries among succeeding film bits in a horizontal row. Yet another problem is how to maintain synchronization of the linear image sensor 200 with the passage of the horizontal film bit rows 106 across the sensor 200 despite fluctuations in film transport speed. This latter problem arises from the desirability of taking a "snap-shot" of the CCD pixels precisely when the center of the current horizontal film bit row 106 is aligned with the linear CCD array 200.

ENCODING SYSTEM

Figure 3:
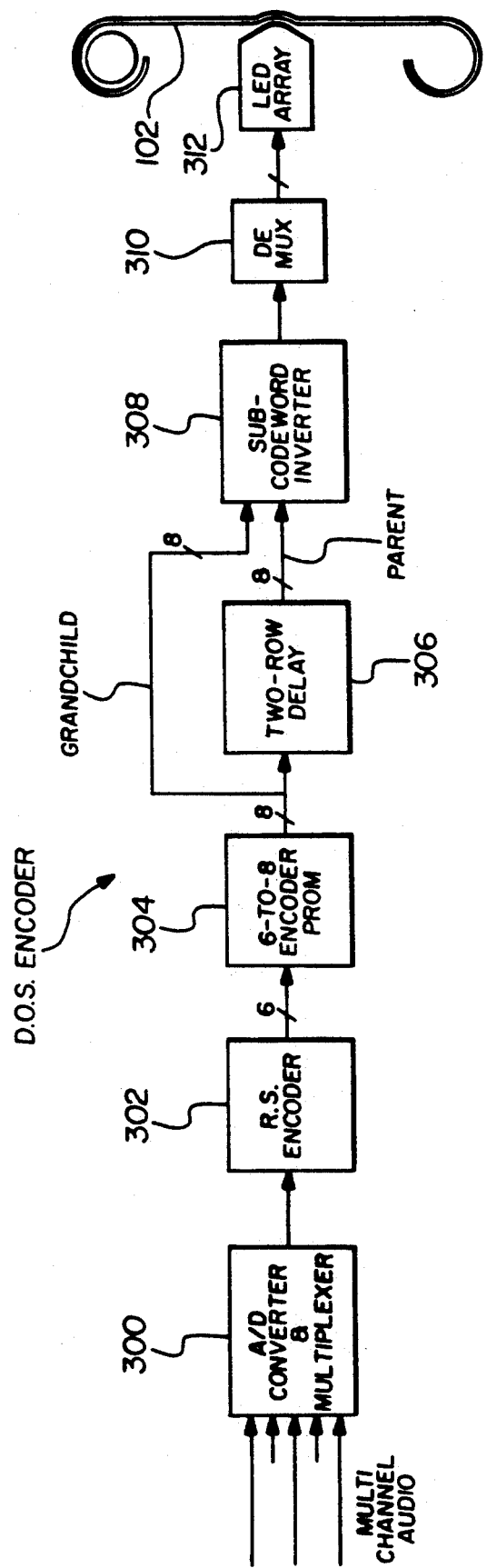
FIG. 3 is a schematic block diagram of an encoding system embodying one aspect of the invention.

FIG. 3 illustrates an encoding system which records digital optical signals in accordance with the invention. An analog-to-digital converter 300 converts, for example, multi-channel analog audio sound signals to binary data streams comprising successive four-bit symbols, and multiplexes them into a single data stream of four-bit symbols. An encoder 302 encodes the data stream in accordance with a BCH error correction code, such as a Reed-Solomon code, and inserts certain control and sychronization bits in predetermined locations.

Figure 4:
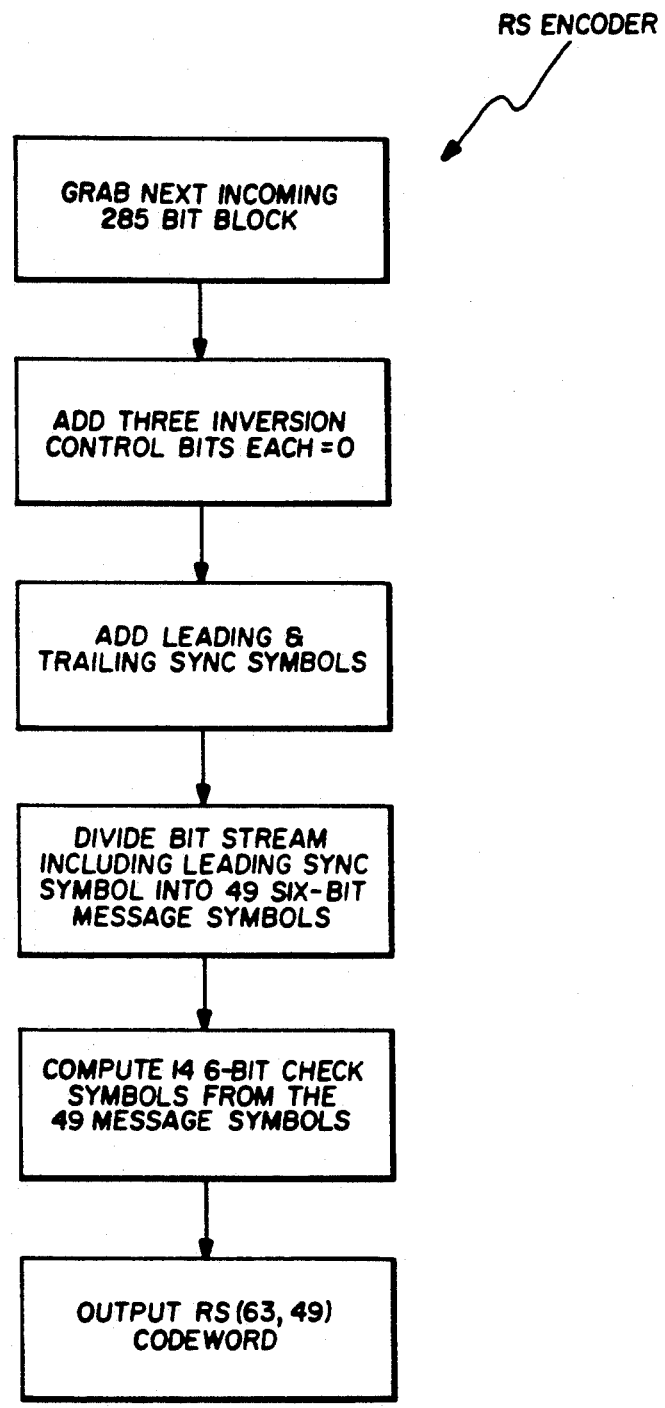
FIG. 4 is a flow diagram illustrating the operation of a Reed-Solomon encoder of the encoding system of FIG. 3.

Referring to FIG. 4, the encoder 302 grabs the next incoming block of 285 bits from the converter 300 and inserts three control bits of zero value as the first, sixth and twelfth bit, respectively, in the data block. The encoder 302 then prefixes and appends six-bit leading and trailing sync symbols, respectively, to the (now) 288—bit block. The encoder 302 then divides the block into 49 six—bit symbols—including the leading sync symbol and not including the trailing sync symbol—and treats these 49 symbols as message symbols. The encoder 302 computes 14 redundant six—bit check symbols in accordance with a code generator polynomial and appends these 14 check symbols to the block to form a 63—symbol codeword. Preferrably, for reasons with will be explained below, the code generator polynomial is a symmetrical or "palindromic" Reed-Solomon code generator polynomial. While in this example the code is an RS(63,49) code, it should be understood that other choices may be made for the number of bits in each audio byte generated by the converter 300, the number of bits in each block grabbed by the encoder 302 and the number of bits in each codeword symbol as well as the number of symbols in each codeword. Thus, palindromic codes other than RS(63,49) may be employed in the invention.

Encoding to Maximize the Number of Useful Film Bit Transistions in the Horizontal Direction As will be explained hereinbelow, when the film bits are to read or played back while the film is projected, distinguishing among the film bits in a given horizontal film bit row and maintaining symbol boundaries within the row is facilitated in the invention by encoding the data to be recorded as film bits in such a manner as to maximize the occurence of alternating zeroes and ones (e.g., clear and opaque film bits) across each horizontal row. However, this must be done without disturbing the information content of the data stream. In order to meet this requirement, the six-bit codeword symbols generated by the encoder 302 are applied in sequence to a 6-to-8 encoder programmable-read-only-memory (PROM) 304, which in turn produces a unique 8-bit symbol for each 6-bit codeword symbol received. The contents of the PROM 304 are illustrated in FIG. 5. The PROM 304 converts each 6-bit symbol to a unique 8-bit symbol whose weight is equal to 4—i.e., there are always four zero-value bits and four one-value bits in each eight-bit symbol. It so happens that there are only 64 six-bit symbols, which is less than the number of eight-bit symbols of weight four. As a result, the PROM 304 provides a unique eight-bit symbol for each six-bit codework symbol, thus avoiding any ambiguity.

FIG. 6 illustrates as a function of film bit position the encoded codeword block produced by the PROM 304. The number of symbols (63) is divisible by 3, and therefore every third symbol in each block is labelled either A, B or C in FIG. 6. Following the leading sync symbol (labelled S01) the most significant bits of the second, third and fourth message bytes (labelled B00, C00 and A01, respectively) are the three control bits inserted by the encoder 302. FIG. 6 illustrates the boundary of the messages symbols, the check symbols and the locations of the leading and trailing sync symbols (labelled S01 and S 0, respectively). It will be remembered that the leading sync symbol is one of the codeword symbols while the trailing sync symbol is not included in the codeword. The last or twenty-third position in each row contains only the first four bits of the corresponding eight-bit symbol, as indicated in FIG. 6. However, as also indicated in FIG. 6, the last four symbols in each row are repeated as the first four symbols of the next row, so that the fourth position includes all eight bits of the symbol corresponding to the last or twenty-third position.

Figure 7:
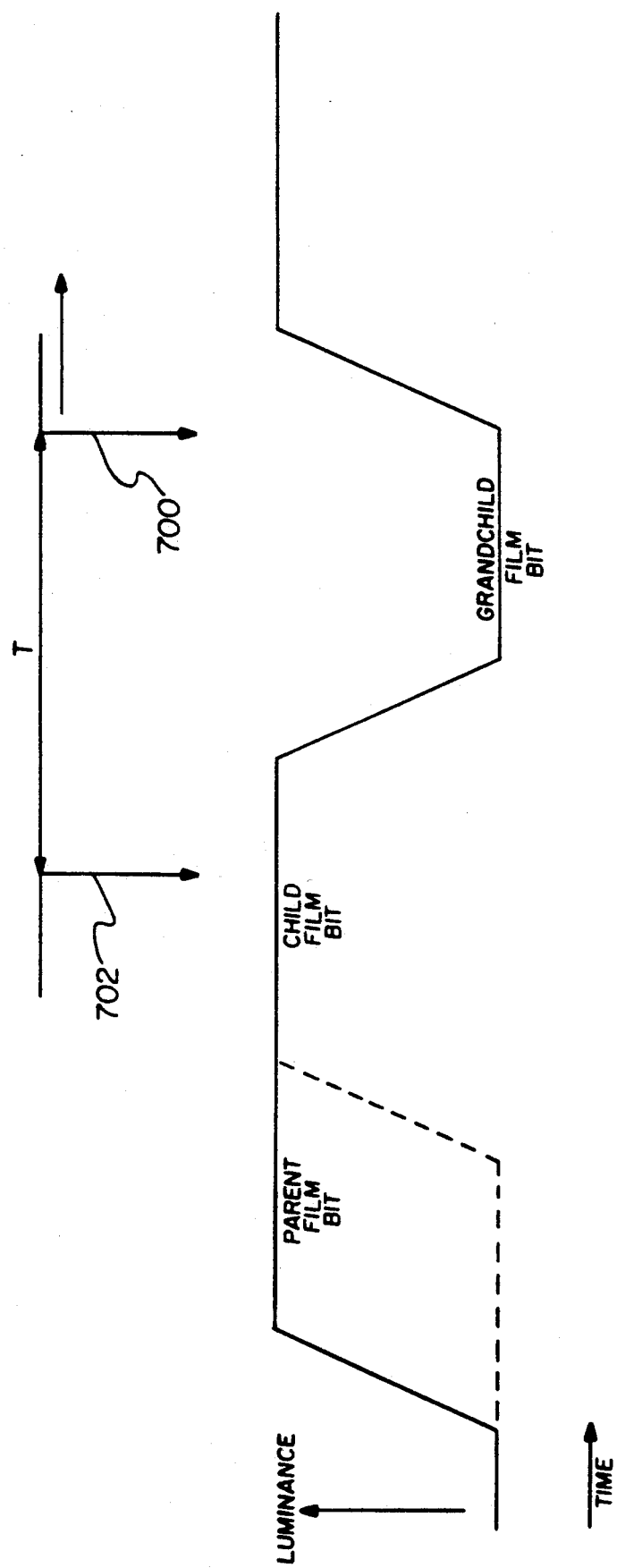
FIG. 7 is a diagram illustrating one example of film byte trasition detected at one image sensor pixel scanning successive film bits as a function of time.
Figure 9:
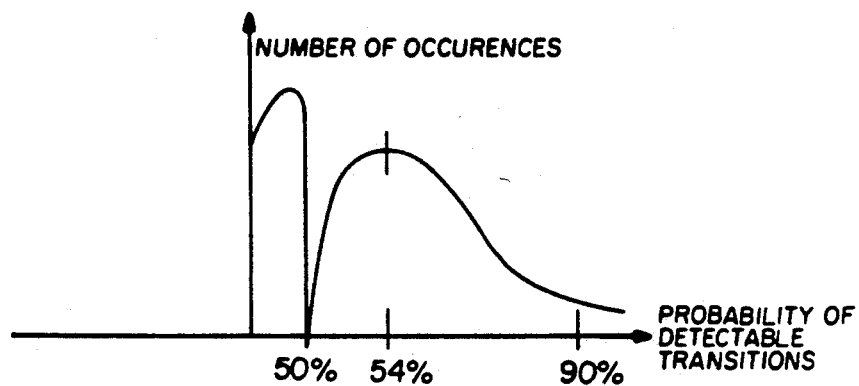
FIG. 9 is a graph illustrating the probability of occurence of useful film bit transitions in the encoded data of FIG. 8.

Encoding to Maximize the Number of Useful Bit Transitions in the Vertical Direction The luminance sensed by the CCD image sensor pixel 104a of FIG. 1 as the film 102 is transported in the projector is illustrated as a function of time in the graph of FIG. 7. If the image sensor 200 is at least nearly synchronized with the actual passage of the centers of successive film bit rows, then pixel positions 700 and 702 represent the occurence of successive "snap-shots" taken by the image sensor 200 at the pixel 104a. Note that the successive film bit luminance values in the film bit column underlying the pixel 104a "fall-off" near the film bit boundaries, because each film bit occupies less of the field of view of the CCD pixel as its center moves away from the pixel.

In the invention, the image sensor is synchronized with the passage of successive film bit rows by tracking the difference between successive film bits. Thus, in effect, the luminance values obtained at the successive sampling times corresponding to the pixel positions 700 and 702 of FIG. 7 are subtracted. However, it should be readily apparent to the alert reader that unless the parent and grandchild film bits (as labelled in FIG. 7) represent opposite binary values, such a subtraction cannot distinguish film bit transitions. Thus, if the dashed line waveform of FIG. 7 is substituted instead of the solid line waveform, subtraction of successive luminance values would yield virtually no information.

Figure 8:
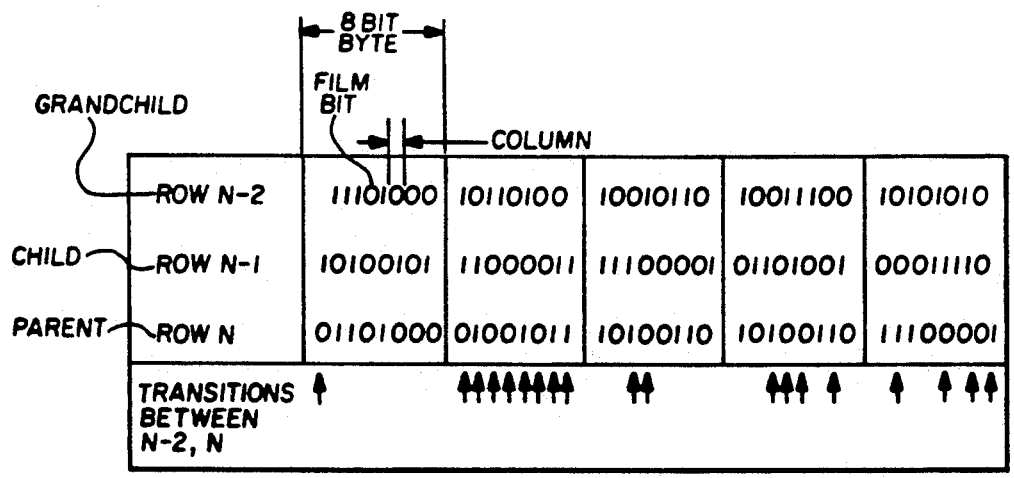
FIG. 8 illustrates useful data transistions in the encoded data generated by the encoder system of FIG. 3.

The problem is illustrated in FIG. 8, in which three successive rows of film bit data are shown in the relative location in which they are recorded on the film. Those columns having useful film bit transitions (in which the parent and grandchild bits differ) are indicated by arrows. In this example, only some of the 40 columns shown have useful transitions. The goal is to increase the number of useful transitions so that they occur in greater than 50% of the columns.

This problem is solved in the invention by transforming each grandchild film bits so as to maximize the number of film bit transitions for which the parent film bit is different from the grandchild film bit within the same vertical film bit column. This results in a probability distribution of useful film bit transitions in which the median occurence of useful film bit transistions is 54% and is never below 50%. However, such an inversion must be reversible upon playback so that the information content of the data is not lost.

For this purpose, the palindromic or symmetrical nature of the code (discussed previously herein) is exploited. In such a code, a codeword is separable into sub-codewords of equal length, which in the case of RS(63, 49) codewords is 31 symbols long, there being three sub-codewords in this example. Each sub-codeword comprises every third symbol of the codeword in this example. Thus, referring to FIG. 6, every third symbol labelled A lies in one sub-codeword, every third symbol labelled B lies in a second sub-codeword and every third symbol labelled C lies in the third sub-codeword. Each sub-codeword may be inverted and the resulting overall codeword is another codeword of the code. In the case of an RS(63, 49) codeword having three sub-codewords, there are eight distinct ways in which the codeword may be inverted. In order to ensure that the inverted codeword is re-inverted back to the original codeword, the three control bits inserted as the most significant bits of the symbols B00, C00 and A01 are initially zero and are each inverted as the corresponding sub-codeword B, C and A is inverted. These control bits thus provide all the information required to re-invert each codeword upon playback and decoding to recover the encoded information.

Figure 10:
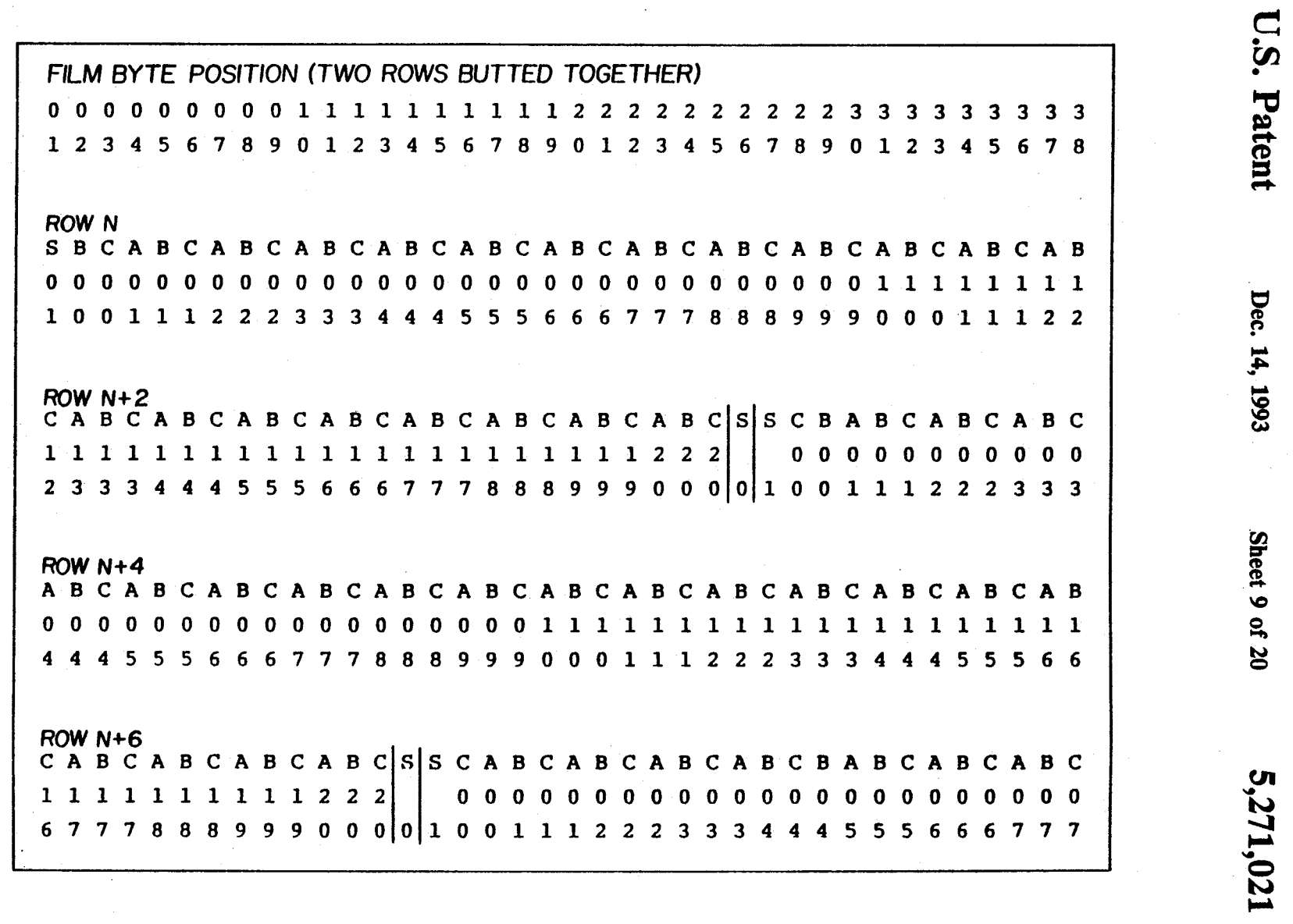

Organization of the film bit data in FIG. 10, in which two rows of film bits are butted together in successive double rows, so that the comparison between parent and grandchild film bits is readily made. Such an organization of the data is made by using a two-row delay circuit (such as a memory) 306. The output of the PROM 304 is applied to the input of the two-row delay 306 and to a grandchild input of a sub-codeword inverter 308. The output of the two-row delay 306 is applied to a parent input of the sub-codeword inverter 308.

Figure 11:
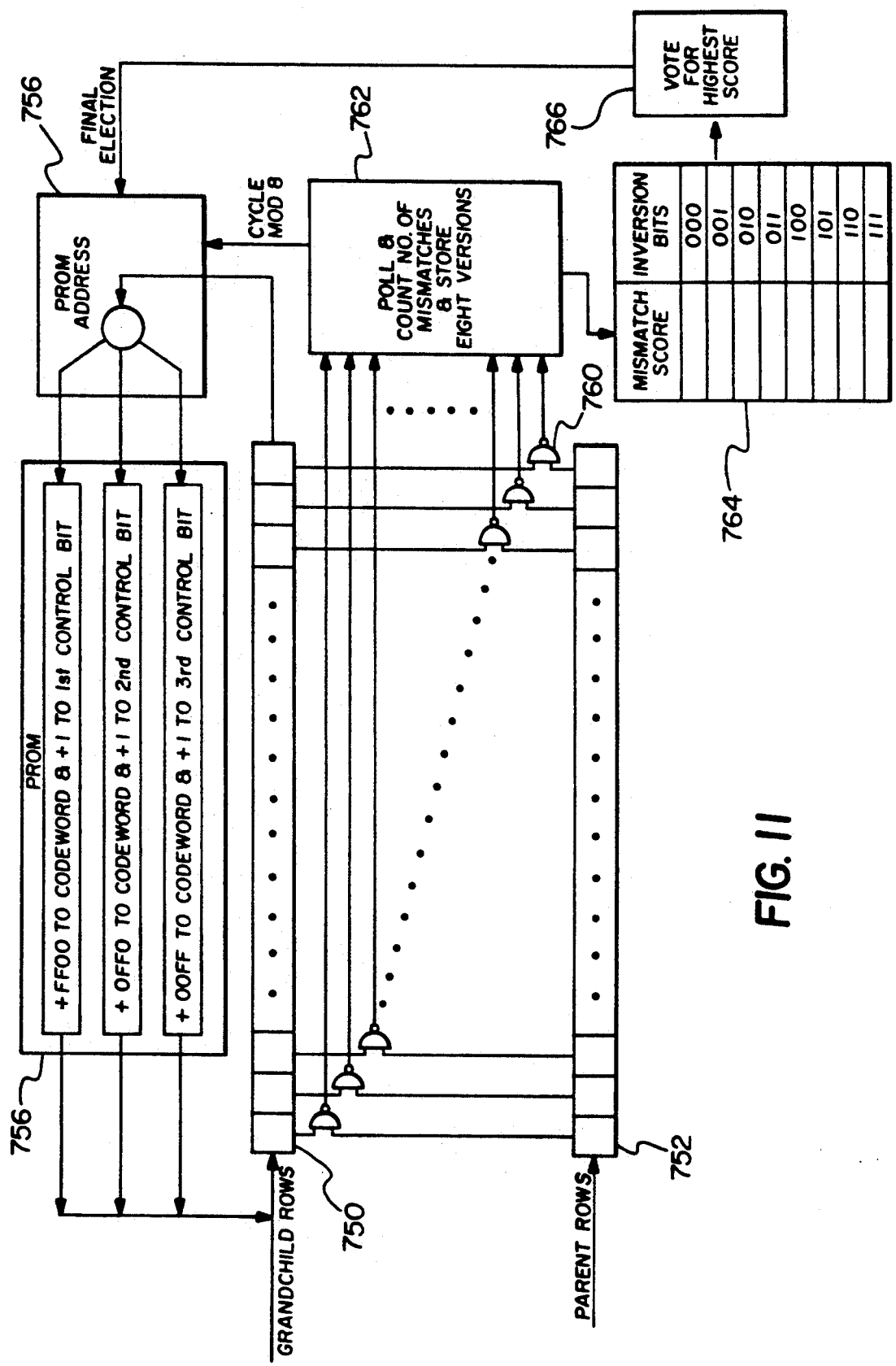
FIG. 11 is a schematic block diagram illustrating the operation of a sub-codeword inverter in the encoder system of FIG. 3.

The sub-codeword inverter 308 is illustrated in FIG. 11. The grandchild film-bit data rows are held in a grandchild register 750 while the parent film bit data rows are held in a parent register 752. Continuing with the example of an RS(63,49) code, the eight possible permutations of the codeword stored in the grandchild register 750 are generated by applying the contents of the grandchild register 750 to the address input 754 of a codeword inversion PROM 756. In the present example, sub-codeword A is inverted by simply adding the pattern FF 00 00 (in hexadecimal) to the codeword, the sub-codeword B is inverted by adding the pattern 00 FF 00 and the sub-codeword C is inverted by adding 00 00 FF. The PROM 756 stores the results of the eight possible permutations of such additions for all 64 possible codewords. In the stored results, the three control bits are inverted as corresponding ones of the sub-codewords are inverted. Thus, by addressing the PROM 756 with the contents of the grandchild register 750, eight possible permutations of the codeword are loaded into the grandchild register 750 in succession and individually compared with the contents of the parent register 752 by a logic network of NAND gates 760 connected between corresponding bits of the two registers. The outputs of all of the NAND gates 760 are polled by a poll logic circuit 762, which counts the number of mismatched bits between the parent and grandchild registers 752 and 750. The poll logic circuit is connected to a memory 764 which stores this number as a score, so that a score is kept for each of the eight possible permutations of the grandchild codeword. A logic circuit 766 detects which version has the highest score and declares that version as the winner to the address input 754 of the PROM 756. The corresponding permutation of the codeword is then loaded by the PROM 756 into the grandchild register 750. This selected permutation is then transmitted by the sub-codeword inverter 308 to a demultiplexer 310 of FIG. 3 and thence to an optical recorder light emitting diode (LED) array 312 for recording of the serial stream of digital bits as film bits on the film 102.

While the preferred embodiment of the invention has been described with respect to an example in which the 6-to-8 encoding is performed prior to selective codeword permutation, the order of these two processes may be reversed and the same result is obtained. The order in which these two processes is performed therefore may be changed by the skilled worker as desired.

Decoding System

Figure 12:
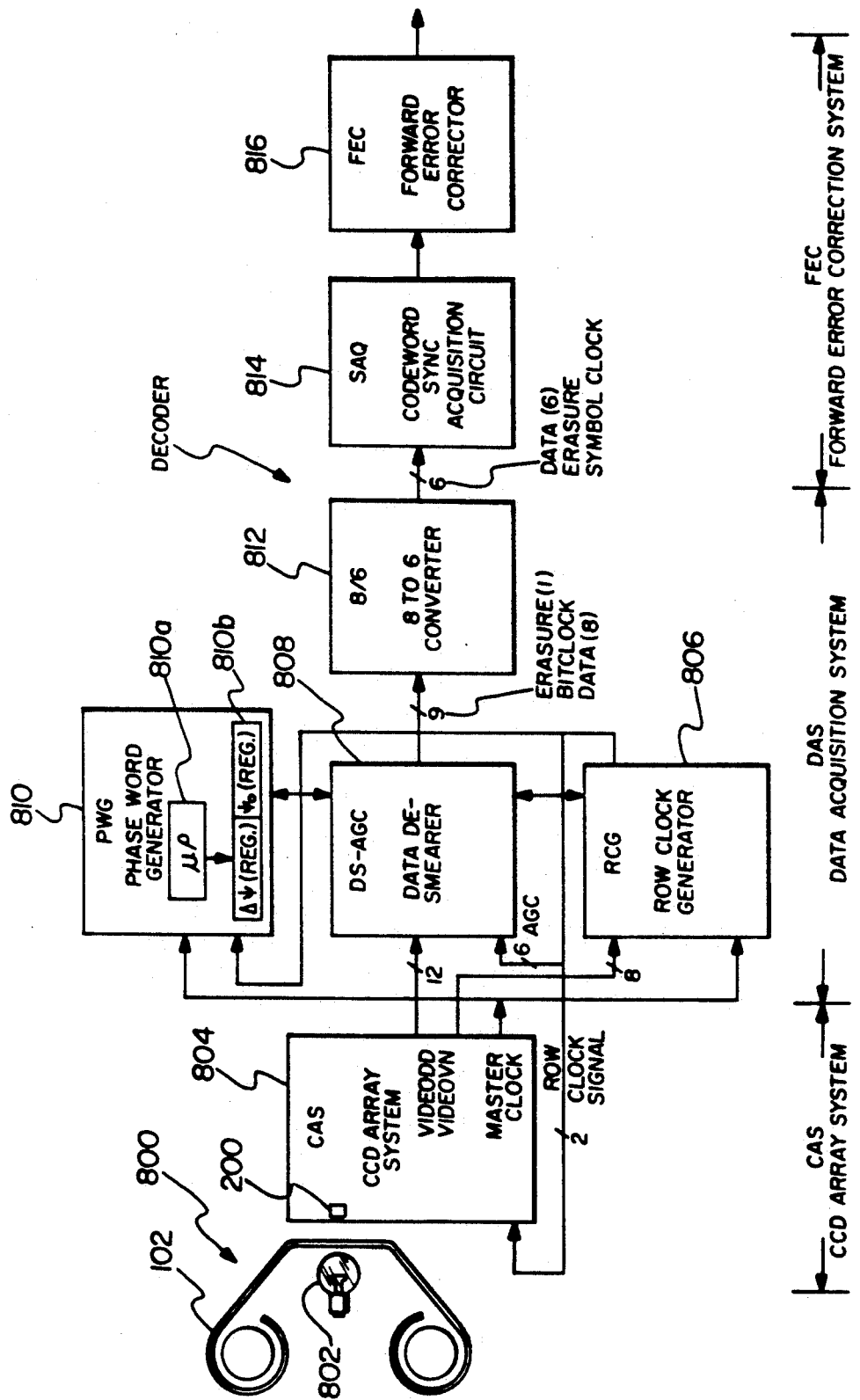
FIG. 12 is a schematic block diagram of a decoding system embodying another aspect of the invention.

After the encoded data has been thus recorded on the film, it must eventually be read back and decoded. A decoding system which reads the data from the film and decodes it is illustrated in FIG. 12. The decoding system is included as part of a film projector 800 which transports the film 102 through a film gate illuminated by a high intensity light source 802. The system further includes a CCD array system 804 (image sensor) comprising the linear CCD array 200 of image sensing pixels shown schematically in FIG. 2. The CCD system 804 causes the CCD array to take a "snap-shot" of the film sound stripe 100 (shown in FIG. 1) in synchronism with a row clock signal SCANCLK. This clock signal is generated by a row clock generator 806. The selection of those individual CCD pixels lying closest to the centers of respective film bits is made by a data desmearer 808 in accordance with the contents of a phase word register 810$a$ maintained by a microprocessor 810$b$ of a phase word generator 810. The data desmearer 808 outputs binary data bits in accordance with the resemblance of respective film bits to clear (binary 0) or opaque (binary 1) squares in the film. The data desmearer 808 also outputs an erasure flag for each bit corresponding to a film bit which did not sufficiently resemble either a clear or opaque square on the film. An 8-to-6 converter converts the eight-bit encoded symbols to six-bit RS(63,49) symbols. Prior to this conversion, symbol boundaries are checked or corrected by the desmearer 808 by sensing which of eight possible periodic symbol boundaries in the stream of eight-bit symbols provides the requisite symbol weight. A codeword sync acquisition circuit 814 detects the presence of the leading and trailing sync symbols to synchronize a forward error corrector 816 so that it grabs each incoming codeword as it is received from the 8-to-6 converter 812. The forward error corrector 816 employs the erasure flags as error location symbols in decoding and correcting the received codeword. The forward error corrector 816 takes advantage of the corrections performed by the desmearer 808 and the 8-to-6 converter 812 by first verifying their efficacy and then deregarding corresponding erasure flags.

Row Clock Generator

Figure 13:
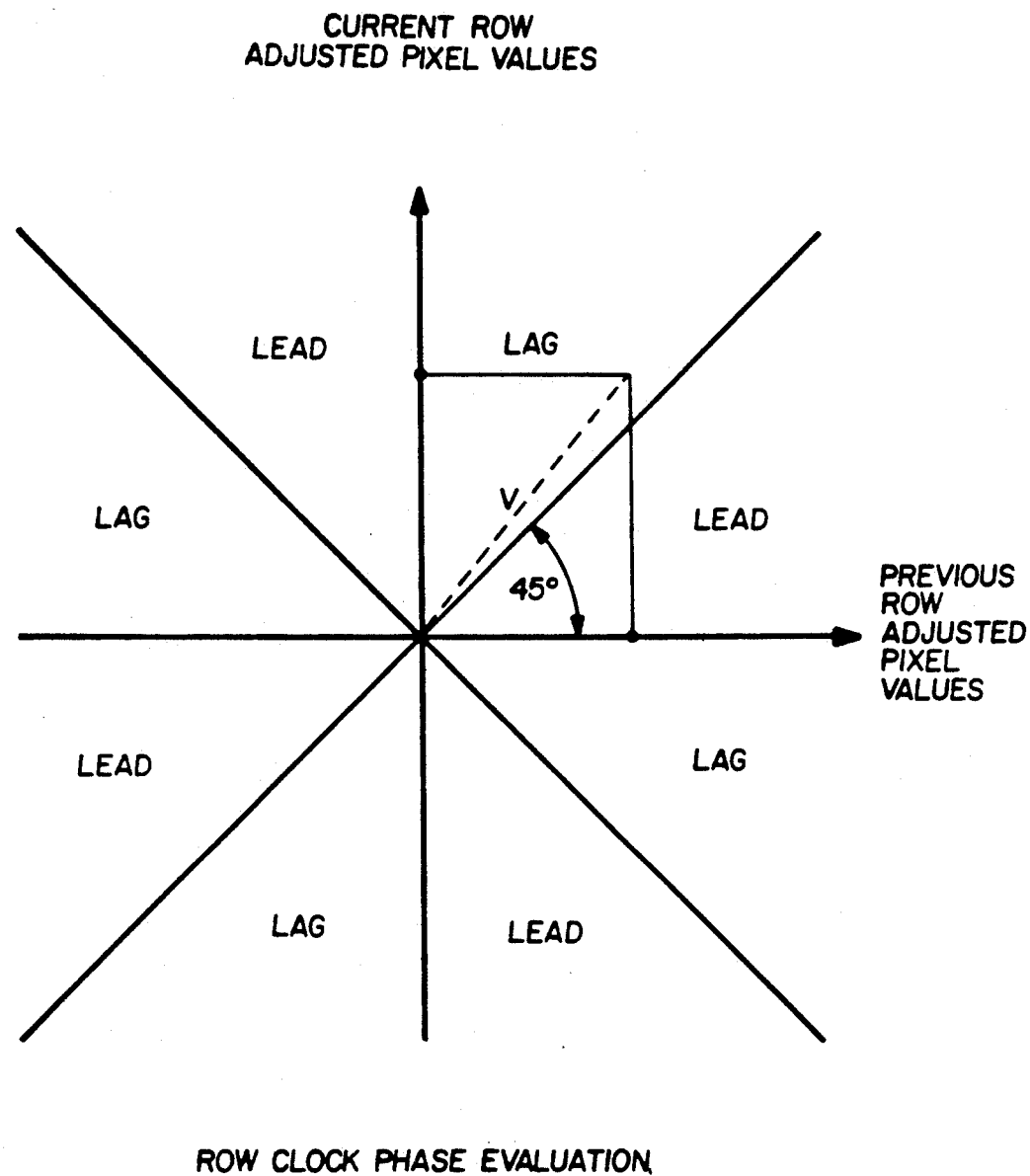
FIG. 13 illustrates the relationship of the various types of useful film bit transitions to a lead and lag condition of a row clock signal of the image sensor with respect to the timing of successive film bit rows.

Making sure that the linear sensor array 200 is centered over the center of each successive horizontal film bit row whenever the row clock signal triggers a "snapshot" by the array 200 is the job of the row clock generator 806. The principle behind its operation is illustrated in FIG. 13. For film bit transitions that meet the criteria FIG. 7 (i.e., the parent and grandchild film bits in a given column differ) a conclusion may be drawn as to whether the CCD array 200 is being triggered by the row clock signal slightly ahead of the center of the current row ("lead") or slightly behind it ("lag"). The vertical axis is the algebraic difference between the luminance of a given pixel in the current row and the average luminance across all pixels in the current row. The horizontal axis is the algebraic difference between the luminance of the same pixel in the previous row and the average luminance across all pixels in the previous row. A vector such as the vector V illustrated in FIG. 13 specifies a pair film bit values of current and previous film bit rows within a given film bit column. Each quadrant of the graph of FIG. 13 is divided along a 45 degree bisector, all vectors lying in one half of the quadrant indicating a "lead" condition and all vectors lying in the other half indicating a "lag" condition. If a vector lies along one of the 45 degree bisectors, no information regarding the timeliness of the row clock signal can be gleaned.

The row clock signal which triggers each "snapshot" taken by the CCD imaging array 200 is regulated in accordance with the foregoing principles by the row clock generator 806 of the decoding system of FIG. 12. The row clock generator 806 is illustrated in the functional block diagram of FIG. 14.

Figure 14:
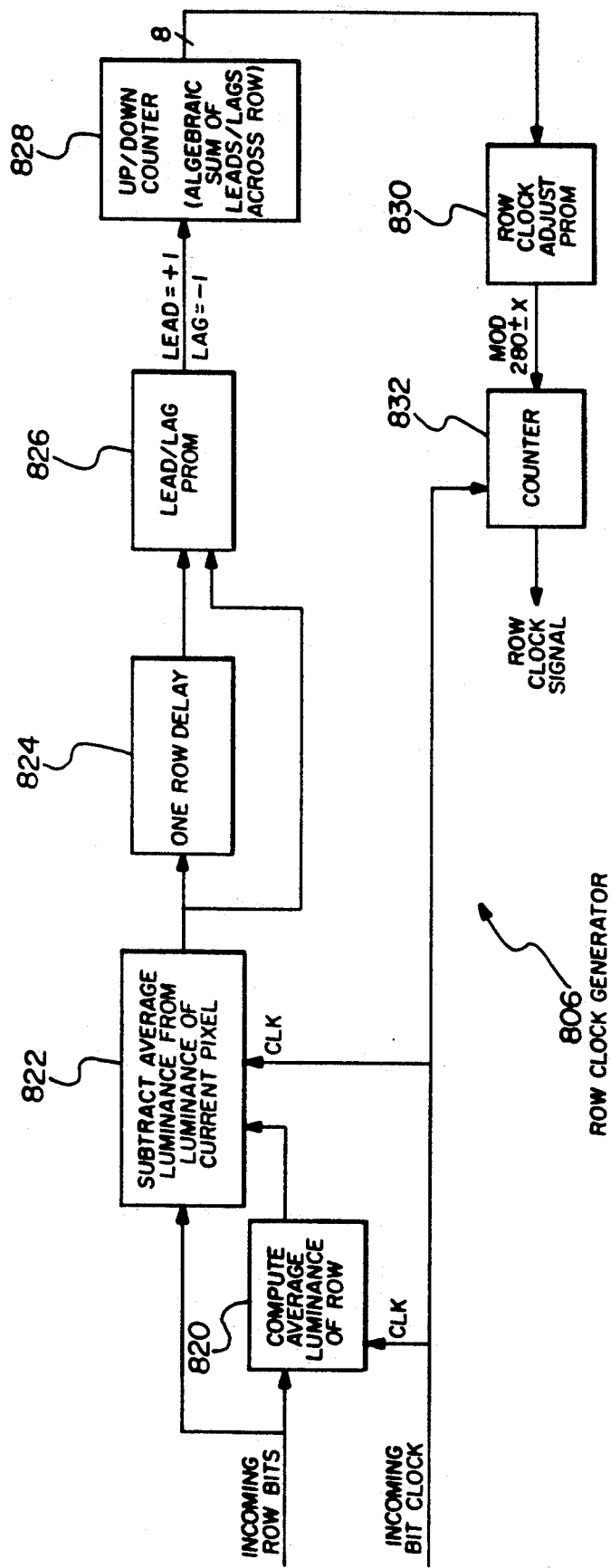
FIG. 14 is a schematic block diagram of a row clock generator in the decoding system of FIG. 12.

Referring to FIG. 14, an adder/accumulator function 820 receives from the CCD array system 804 the luminance values of all the film bits in the current film bit row and computes the average luminance across the entire row. A subtractor function 822 subtracts the average luminance from the luminance values of each film bit in the row and transmits the resulting "normalized" luminance values to a one-row delay function 824 and to one address sub-port of a lead/lag PROM 826, one film bit at a time. Simultaneously, the lead/lag PROM 826 receives at another address sub-port the corresponding normalized luminance values of the previous film bit row from the one-row delay function 824, one film bit at a time. Together, the two address sub-ports comprise the address port of the lead/lag PROM 826.

The lead/lag PROM 826 implements the diagram of FIG. 13. For this purpose, it stores for all possible combinations of luminance value pairs of the current and previous film bit rows the appropriate lead or lag indications in accordance with the diagram of FIG. 13. For each film bit pair across one row, the lead/lag PROM transmits either a lead or lag or "hold" (do nothing) indication to an up/down counter 828. The contents of the up/down counter 828 is reset at the beginning of each film bit row. The up/down counter 828 counts up one or down one in response to each lead or lag command, respectively, received from-the-lead/lag PROM 826. As soon as the lead/lag PROM 826 has processed all the film bits of the current row, the up/down counter 828 contains the algebraic sum of all lead and lag conditions of the current row, which is a reliable indication of whether the row clock signal actually leads or lags the coincidence in time of the center of the current film bit row with the linear CCD imager array 200 of the CCD array system 804. The contents of the up/down counter 828 is applied to the input of a row clock adjustment PROM 830. The row clock adjustment PROM 830 responds by producing a binary number equal to the number of clock cycles N normally required by the CCD imager system 804 to cycle and refresh all of its pixels in the well-known fashion (typically 280) plus a positive or negative number x (typically +5 or −5). Whether x is positive or negative depends upon whether the contents of the up/down counter 828 indicates a preponderance of lead or lag conditions, respectively, for the current film bit row. This binary number is then employed as the modulus of a counter 832 whose output is the row clock signal controlling the CCD array system 804. The row clock adjustment PROM correlates all possible values which the contents of the up/down counter may assume to either N+x or N−x as appropriate, in accordance with the foregoing description. The PROM's 826 and 830 are readily programmed by the skilled worker in accordance with the foregoing description.

Phase Word Generator

While the row clock generator 806 assures that the CCD array 200 is triggered in the middle of the current film bit row, thus centering each image sensor pixel with respect to the film bit rows in the vertical direction, it is also neccessary to select those image sensor pixels most nearly centered in the horizontal direction with respect to the film bits. Such a selection is controlled by the phase word generator 810 of the decoding system of FIG. 12.

The phase word generator 810 employs an angular coordinate system for specifying the horizontal location along the linear imager array 200 (illustrated in FIG. 2) with respect to the film bit locations. This angular coordinate system is illustrated in FIG. 2. The horizontal position is denoted $\psi$ and is expressed in units in which the width W of one film bit is defined as unity. The width w of each CCD imaging pixel in the linear array 200 (which is presumed to be the same for all such pixels) is denoted $\Delta\psi$, and is expressed in the same units wherein the width W of one film bit is defined as unity. For the exemplary system, there are about 512 CCD pixels in the linear array 200 spanning about 161 film bits (although this may vary depending upon the hardware design and the area of the film bit photographically recorded on the film), so that $\Delta\psi=0.3$ approximately, as indicated in FIG. 2. It should be apparent that the fractional part of $\psi$ (or $\psi$ mod 1) equals 0.5 at the center of each film bit. The displacement between the inside edge 100a of the sound strip 100 and the leading pixel (pixel #0) of the array 200 is denoted $\psi_0$, which in the example of FIG. 2 is 0.525 (i.e., about half a film bit width). As will be seen below in connection with the desmearer 808, the locations of the centers of each of the pixels in the linear array 200 expressed in terms of the angle $\psi$ are known. The goal, then, is to always know the value of $\psi$ at the center of each film bit so that the desmearer 808 may select for each film bit the CCD pixel most nearly centered over the film bit, despite lateral wandering of the film with respect to the linear array 200.

Figure 15:
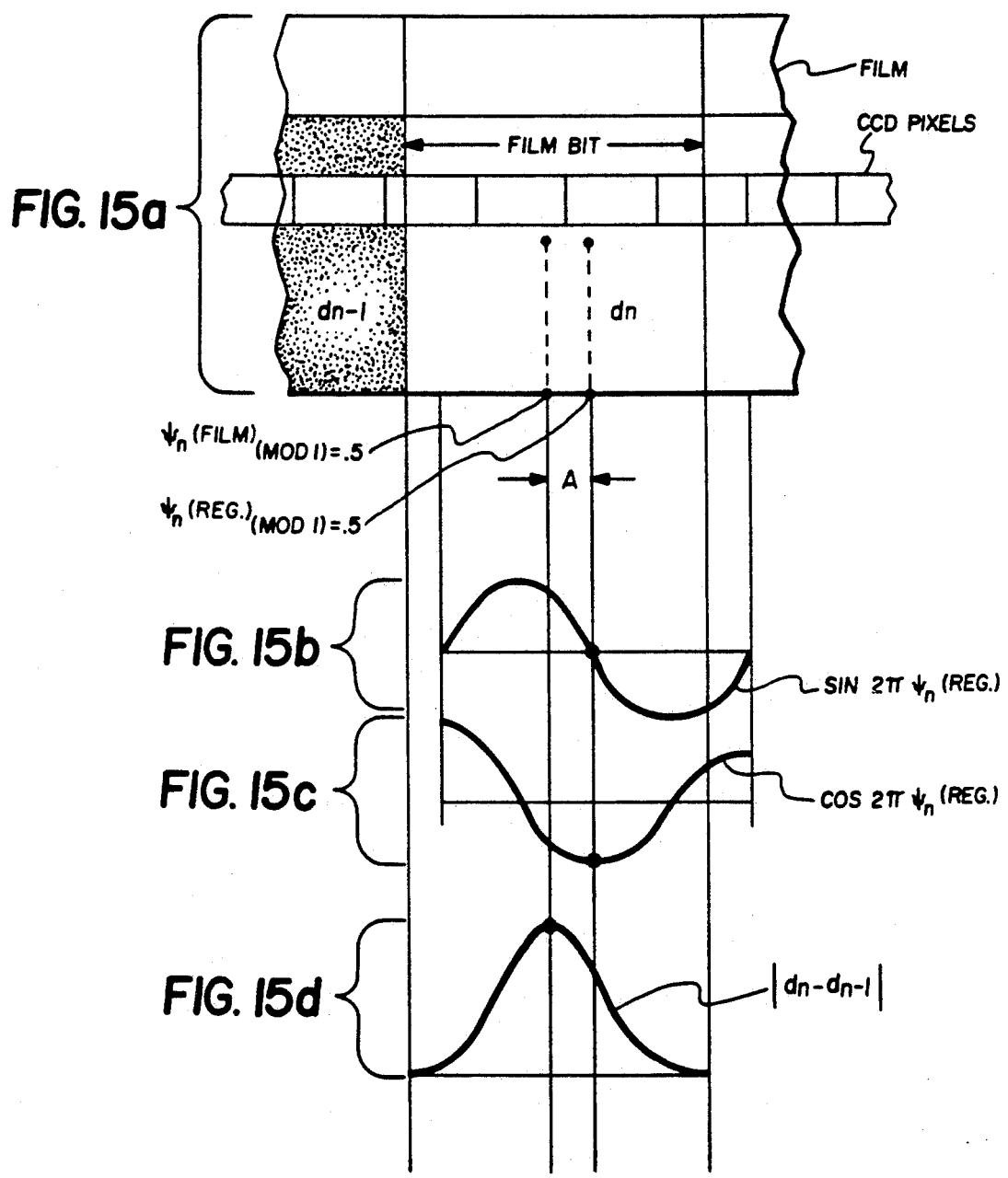
FIG. 15a is a pictorial diagram corresponding to FIG. 2.
FIGS. 15b and 15c are graphs corresponding to FIG. 15a and illustrating the periodic nature of sines and cosines, respectively of the horizontal location in a row of film bits with respect to the film bit boundaries.
FIG. 15d is a graph corresponding to FIG. 15a and illustrating the film bit transition magnitude sensed by individual pixels of the image sensor as a function of horizontal location along the sensor.

This goal is met recognizing that:

(a) sin $2\pi\psi$ and cos $2\pi\psi$ are periodic across each film bit row, (b) if $d_n$ and $d_{n-1}$ are the luminance values of the current and previous film bits, respectively, within the same horizontal row, then, referring to FIGS. 15a, b, c and d, the cumulative sums across many film bits in the same row of:

$$s_n = |d_n - d_{n-1}| \sin 2\pi\psi \quad (1)$$

$$c_n = |d_n - d_{n-1}| \cos 2\pi\psi \quad (2)$$

are very small and very large, respectively, if the angular error A (depicted in FIG. 15) between the estimated horizontal location $\psi_n^{(reg)}$ of the center of the $n^{th}$ film bit and the actual location on film $\psi^{(film)}_n$ of the center of the n film bit is small. This is in part due to the selection of the eight-bit symbol weight of four. (As discussed previously herein, the selection of weight four was made to enhance the horizontal alignment control.)

Figure 16:
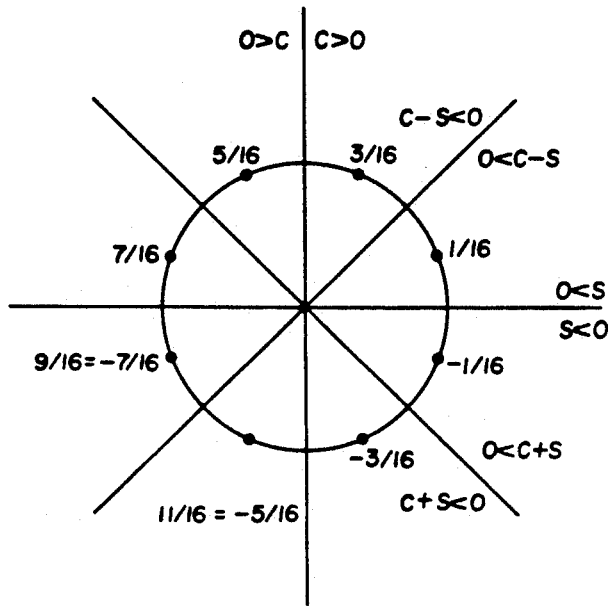
FIG. 16 illustrates a simple test based upon cumulative sums of the sines and cosines of FIGS. 15b and 15c to determine the error in the current estimate of the periodic horizontal locations of the centers of successive film bits.

One way of estimating the angular error A to within a fraction of the width W of one film bit is illustrated by the chart of FIG. 16. In this chart, the following definitions use the quantities discussed above:

$$C = C_{i,j} = \sum_{n=i}^{j} c_n, \quad (3.)$$

$$S = S_{i,j} = \sum_{n=i}^{j} s_n. \quad (4.)$$

The angular error A may be estimated by computing:

$$A = A_{i,j} = (\tfrac{1}{2}\pi) \arctan(S_{i,j}/C_{i,j}), \quad (5)$$

where $n = (i+j)/2$.

Figure 17:
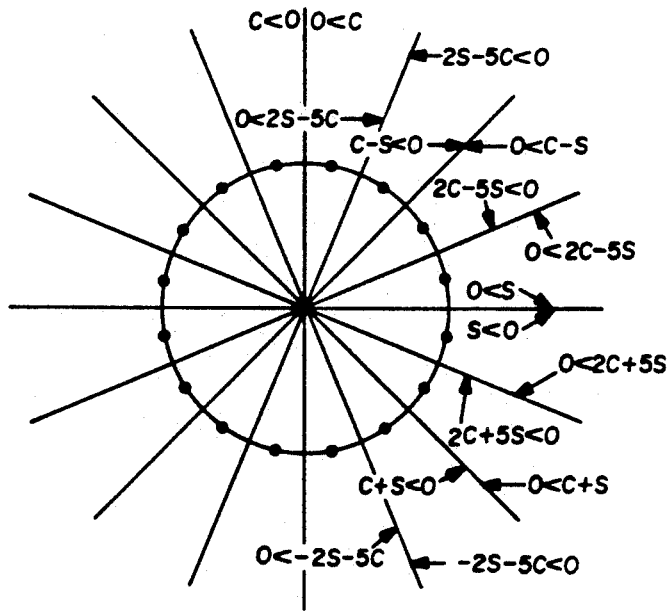
FIG. 17 illustrates a more robust version of the test illustrated in FIG. 16.

FIG. 16 shows how to estimate A to within an error of one-sixteenth of a film bit width W by simply determining (a) which one of S and C is the greater, (b) whether their sum is a negative number, (c) whether their difference is negative number and (d) whether each of them is a positive or negative number. Thus, in one alternative embodiment of the invention, the phase word generator 810 performs the computations in a microprocessor 810a of equations (1.) through (4.) above to determine S and C. The microprocessor 810a then performs the tests (a) through (d) above to estimate the angular error A in accordance with the chart of FIG. 16. The microprocessor 810a then changes the values of $\psi$ and $\Delta\psi$ stored in a phase word register 810b to compensate for the error. A slightly more accurate version of this approach is illustrated in FIG. 17.

Figure 18:
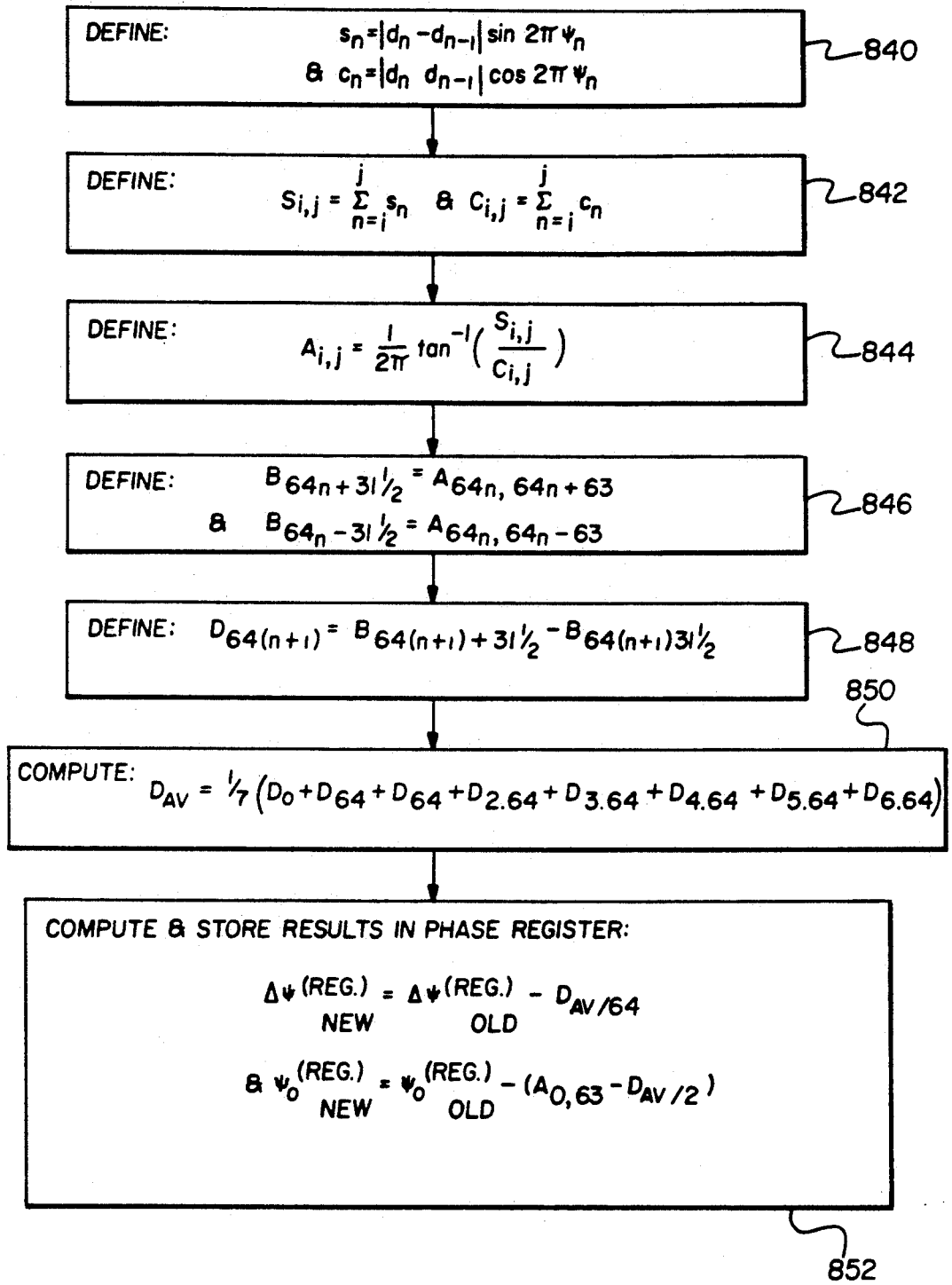
FIG. 18 is a flow diagram illustrating the operation of a microprocessor in a phase word generator of the decoder system of FIG. 12.

In the preferred embodiment of the invention, however, the microprocessor 810a (or its equivalent in dedicated logic circuits) performs the algorithm depicted in the flow chart of FIG. 18. In this algorithm, the microprocessor maintains the definitions of equations (1.) through (5.) above in blocks 840, 842 and 844. It further defines the partial sums of block 846 and block 848. The microprocessor 810a then performs the computations of block 850 using the partial sums defined previously in the preceeding blocks to produce an average correction $D_{av}$. The microprocessor 810a then employs the average correction $D_{av}$ to update the values $\psi^{(reg)}$ and $\pi\psi^{(reg)}$ stored in the phase register 810b by performing the computations of block 852.

While the partial sum algorithm of FIG. 18 continuously monitors the angular errors at the $64^{th}$ film bit position in the row (as can be seen from the computations depicted in FIG. 18), any other film bit position not too near the sound stripe edges may be selected for the algorithm.

Data Desmearer

The first task of the data desmearer 808 of the decoding system of FIG. 12 is to use the angular values $\psi$ and $\pi\psi$ currently stored in the phase register 810b to choose only those pixels in the linear array 200 which are most nearly centered in the horizontal direction over respective film bits in the current horizontal film bit row. The data desmearer 808 does this by performing the process illustrated in the block diagram of FIG. 19. (For this purpose, the data desmearer 808 may be either a programmed microprocessor or dedicated logic hardware, either of which is readily adapted by the skilled worker to perform the process of FIG. 19.)

At the beginning of each row (signified by the row clock signal changing state), the value of $\psi$ is initialized to $\psi_0$, which is stored in the phase word register 810b and is the distance between a reference point such as sound stripe edge and the center of the first pixel in the linear array, as illustrated in FIG. 2. This initializing step is depicted in block 860 of FIG. 19.

The new value of $\psi$ is then computed adding $2\pi\psi$ (taken from the phase word register 810b) to the old value (block 862). A determination is then made as to whether this change in $\psi$ changes the non-fractional bits of $\psi$ (block 864). If not, the next film bit has not been reached and therefore $\psi$ must be incremented again ("NO" branch of block 864). Otherwise, the desmearer 808 grabs the luminance value of the next odd-numbered pixel in the linear array 200 (block 866). The desmearer 808 knows how to do this because it knows the location value $\psi$ of the center of each pixel in the array 200, as illustrated in FIG. 2.

A determination is then made whether the fractional part of $\psi$ is less than 0.375 (block 868). (It should be noted this value depends upon the number of film bits per horizontal row and the number of CCD imager pixels spanning the row, which in the present example is approximately 161 and exactly 512, respectively.) Depending upon the outcome of this determination, the desmearer 808 grabs the luminance value of either the next or the previous even numbered pixel in the array 200. The object here is to select two adjacent pixels horizontally spanning the center of the current film bit. A weighted luminance value $d_n'$ is then computed from the luminance values $d_{n\ odd}$ and $d_{n\ even}$ of the odd and even pixels which have now been grabbed. The weighting is based upon the relative proximity of each of the two pixels to the center of the film bit, such that if one of the two pixels is directly centered over the film bit, the other pixel is completely ignored, while if the two pixels symmetrically span the film bit, they are weighted equally.

Such a weighting process is shown in blocks 874a, defining the weight of the odd pixel luminance value, 874b, defining the weight of the even pixel luminance value and 874c, depicting the computation of the weighted luminance value from the odd and even luminance values.

The weighted luminance value $d_n'$ is then compared with predetermined luminance values $d_0$ and $d_1$ characteristic of a pixel centered over a clear (zero) or opaque (one) film bit, and a binary zero or one data bit is transmitted depending upon whether $d_n'$ is closer to $d_0$ or $d_1$, respectively (block 878). Then, if the weighted luminance value $d_n'$ is not sufficiently close to either $d_0$ or $d_1$ to within a predetermined threshold, the desmearer 808 transmits an erasure flag bit = 1 along with the data bit (block 880). The predetermined threshold may be set such that an erasure flag bit is transmitted whenever $d_n'$ is not within 33% of either $d_0$ or $d_1$. The luminance values $d_0$ and $d_1$ are readily predetermined by the skilled worker by simply noting the luminance values of CCD pixels centered over clear and opaque film bits, respectively.

Figure 19:
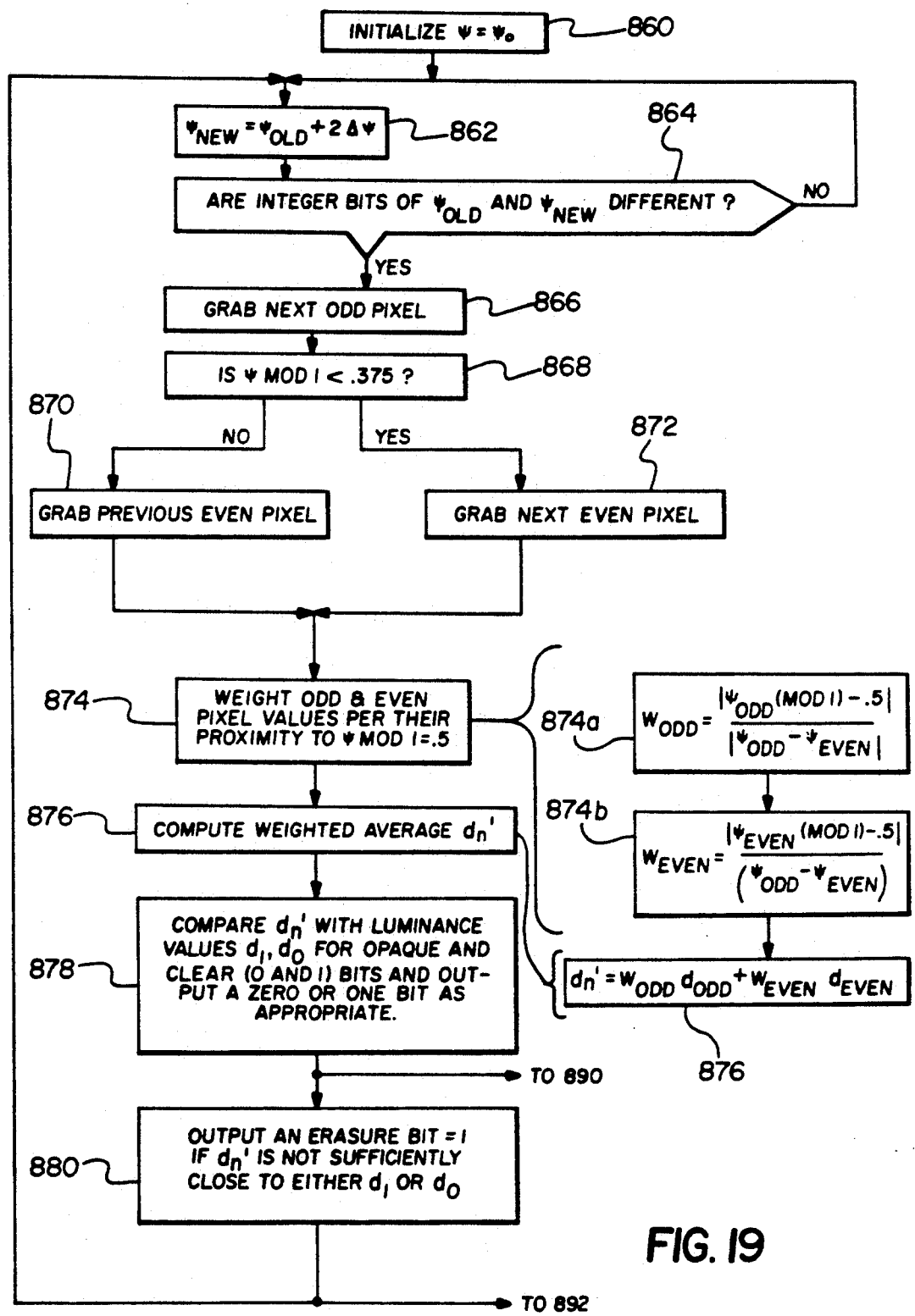
FIG. 19 is a flow diagram illustrating the operation of a data desmearer of the decoder system of FIG. 12.

The process of FIG. 19 then returns to block 862 to update $\psi$ using the latest value of $\delta\psi$ stored in the phase word register 810b, and the foregoing cycle is repeated until the end of the current horizontal film bit row is reached.

Figure 20:
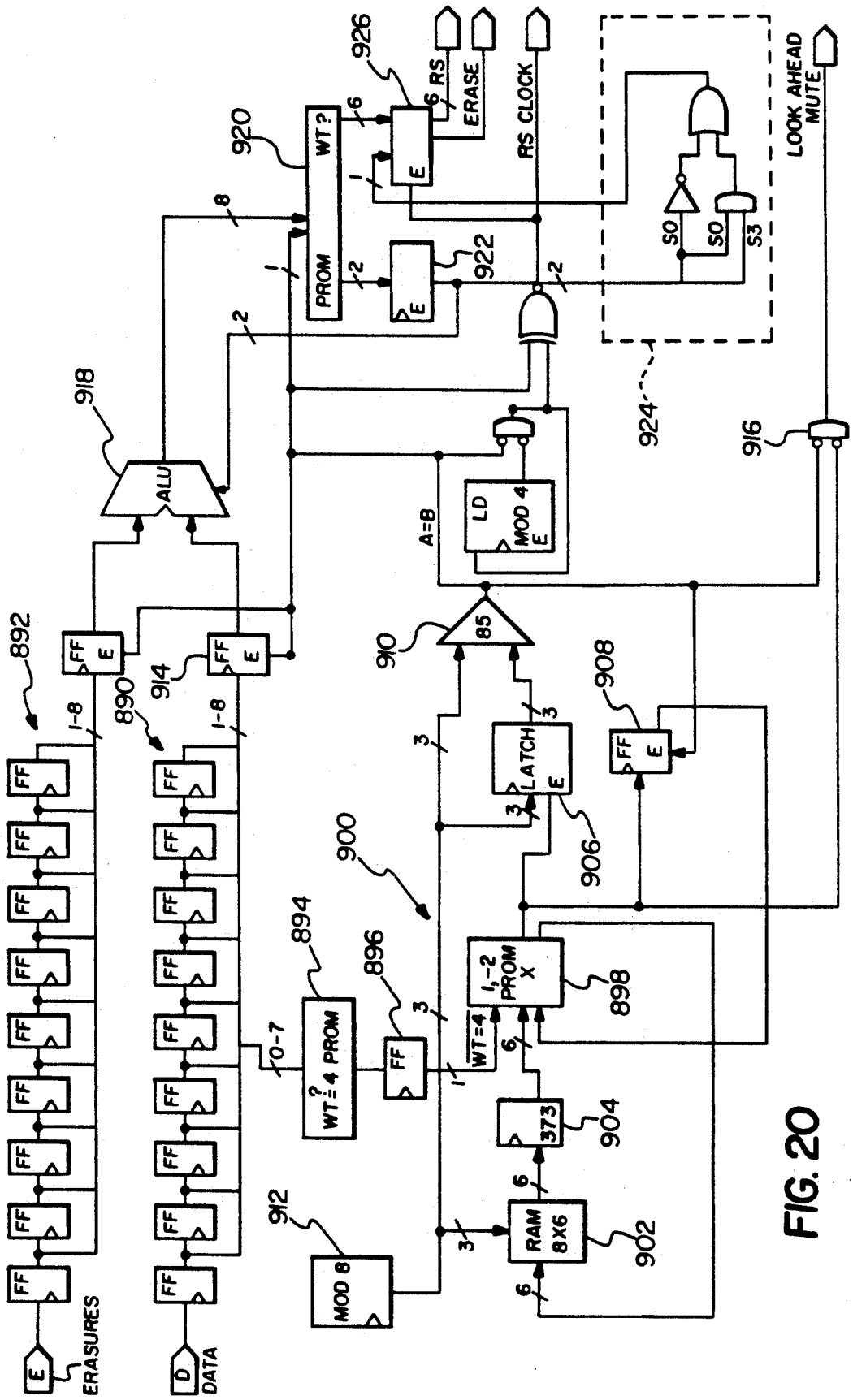
FIG. 20 is a block diagram of the data desmearer of the decoder system of FIG. 12.

First Level Error Correction, Symbol Sync Detection and 8-to-6 Conversion Channel Decoding by the Data Desmearer Another aspect of the data desmearer 808 is illustrated in the schematic block diagram of FIG. 20. The circuit of FIG. 20 takes advantage of the 6-to-8 channel encoding performed by the 6-to-8 encoder PROM 304 of the encoder system of FIG. 3 and of the erasure flag bits produced in accordance with the process of FIG. 19 to correct and maintain symbol-to-symbol boundaries and to perform a first level error correction process.

Referring to FIG. 20, the data bits produced in the step of block 878 of the process of FIG. 19 are stored sequentially in an eight-bit data register 890 while the corresponding erasure flag bits produced in the step of block 880 of the process of FIG. 19 are stored in corresponding locations in an erasure flag register 892. The contents of the data register 890 are applied to the address input of a weight=4 PROM 894. The PROM is programmed so as to transmit a one-bit only if the eight bit sequence in the data register has a weight of four. It will be recalled that the 6-to-8 encoder PROM 304 of the encoder system of FIG. 3 mapped each 6-bit RS(63,49) symbol to a unique 8-bit symbol of weight four (i.e., number of one-bits equals four in each 8-bit symbol). It will be further recalled that the reason given hereinabove for performing such a channel encodement was to enhance the horizontal direction synchronization or centering, performed by the phase word generator 810 in accordance with the process of FIG. 18. However, as will be seen hereinbelow, the 6-to-8 channel code provides additional advantageous functions.

Symbol Boundary Control:

The output of the weight=4 PROM 894 sets a flip-flop 896 controlling one address bit of a scoring PROM 898. The scoring PROM 898 is part of a symbol boundary control loop 900, including a score random access memory (RAM) 902, an input latch 904, an output latch 906, an output flip flop 908, a comparator 910 and a modulus eight (mod 8) counter 912. The number of bits at each input and output of each of the foregoing elements of the symbol boundary control loop 900 is indicated in FIG. 20.

The symbol boundary control loop 900 operates as follows. With each shift of the data register 890, the weight=4 PROM 894 causes an enabling signal to be applied to one address input of the score PROM 898 if the eight-bit data sequence stored in the data register does not have weight four. If such an enabling signal is received, the scoring PROM 898 decrements the current one of eight six-but locations in the score RAM 902 by one. Otherwise, the scoring PROM 898 increments this location by two. Then, with the next shift of the data register 890, the mod-8 counter 912 addresses the next one of the eight locations in the score RAM 902 and the process is repeated. With each such cycle, the score RAM 902 informs the scoring PROM 898 of the score in the current memory location. As soon as the scoring PROM 898 receives a score of 63, it declares the current cycle of the mod-8 counter to be the "winner'-'—i.e., the current cycle defines the proper boundary between successive eight-bit symbols in the data bit stream received by the data register 890. This cycle number (a three bit number) is stored in the latch 906. Then, as each winner is declared by the scoring PROM 898, the comparator compares the current cycle of the mod-8 counter 912 with the cycle of the previous winner (the contents of the latch 906). If there is a match, this means that the symbol boundary has not changed since the previous symbol and therefore there has been no detected symbol boundary error. Therefore, the comparator 910 enables a serial-to-parallel flip-flop 914 at the output of the data register 890 so that the current contents of the data register is output is an eight-bit symbol. If there is a mismatch, however, the comparator 910 causes a mute flag to be transmitted by a logic gate 916. This mute flag identifies the current symbol to the forward error corrector 816 of FIG. 12 as being one in which the symbol boundary is incorrect and therefore as a useless symbol. As will be explained hereinbelow, this mute flag warns the forward error corrector that the entire codeword may not be correctable, due to the loss of symbol synch, and should therefore be muted. In this case, the user may perform other procedures. For example, if the data represents digital audio data, the user may fill in for the muted codeword by performing audio interpolation.

After declaring a "winner", the scoring PROM 898 prevents overly frequent changes to the symbol boundary by preventing the score of any other one of the eight memory locations from increasing, although any score is allowed to decrease, including the score of the "winner". If the winner's score decreases below the maximum (63), then there is no declared "winner" and any score is allowed to advance in the manner described above. This latter feature is implemented by the connection between the output of the comparator 910 and the flip-flop 908. The output of the flip-flop 908 is connected to an address input of the scoring PROM 898 so as to disable the PROM 898 from advancing the scores stored in the score RAM 902 as long as the current declared winner is the same as the previous declared winner.

First Level Bit Error Correction:

As soon as the serial-to-parallel flip-flop 914 is enabled, the eight bits stored in the serial data register 890 are simultaneously applied through an arithmetic logic unit (ALU) 918 to eight parallel address bit inputs of a correcting weight=4 PROM 920. The correcting weight=4 PROM 920 determines whether the weight of the eight bits is four. If so, this indicates that the eight bits are most likely correct and can therefore be transmitted "as is" to the forward error corrector 816. However, if the weight is not equal to four, then the PROM 920 transmits inverting flag through a latch 922 to the ALU 918. In response, if the weight was less than four, the ALU 918 attempts to correct individual bits stored in the data register 890 by logically ORing them with corresponding bits stored in the erasure flag register 982. On the other hand, if the weight is greater than four, the ALU 918 AND's each of the bits stored in the data register 890 with corresponding bits in the erasure register 892, these latter results being applied to the PROM 920. The results of this correction attempt are then transmitted to the eight address inputs of the PROM 920, which again determines whether they are of weight four. If the weight is now found to be four, then the attempt has succeeded and the eight bit symbol is converted by the PROM 920 to the corresponding six-bit symbol for transmission to the forward error corrector 816. Otherwise, if the symbol weight is still not four, the correction attempt has failed. At this point, no further correction attempts are made by the ALU 918. Instead, the PROM 920 issues an erase flag to the forward error corrector 816. The forward error corrector 816 responds to this erase flag by treating the current symbol as an erasure.

The skilled worker may readily implement the foregoing functions in the data desmearer 808 by appropriate logic circuitry 924 and an appropriately programmed output PROM 926 connected to the PROM 920 as illustrated in FIG. 20. In summary, the data desmearer 808 provides the forward error corrector 816 with either a six-bit symbol, or a symbol erasure flag or a mute flag.

Erasure Processing by the Forward Error Corrector

The forward error corrector 816 performs the error correction required to recover the information (e.g., digital audio) bits from each RS(63,49) codeword, using well-known techniques. The codeword is delineated by the leading and trailing sync symbols discussed previously herein in connection with FIG. 6 and comprises 63 six-bit symbols received in succession from the data desmearer 812. The delineation of the codeword is performed by the codeword sync acquisition circuit 814 using techniques well-known in the art.

Generally, the forward error corrector employs a Reed-Solomon decoder algorithm which can correct the codeword as long as the sum of the number of erasures (errors of known locations) and twice the number of error (of unknown locations) does not exceed r, the number of check symbols in the codeword, which in this case is 14. However, it is desirable to limit this sum to a number h less than 14 in order to reduce the probability of the decoder performing a misdecode. h may be on the order of 10 or 12 in the present example of RS(63,49). The forward error corrector does this in a manner which optimizes the decoding correction performance, in accordance with the error correction process illustrated in FIG. 21.

Figure 21:
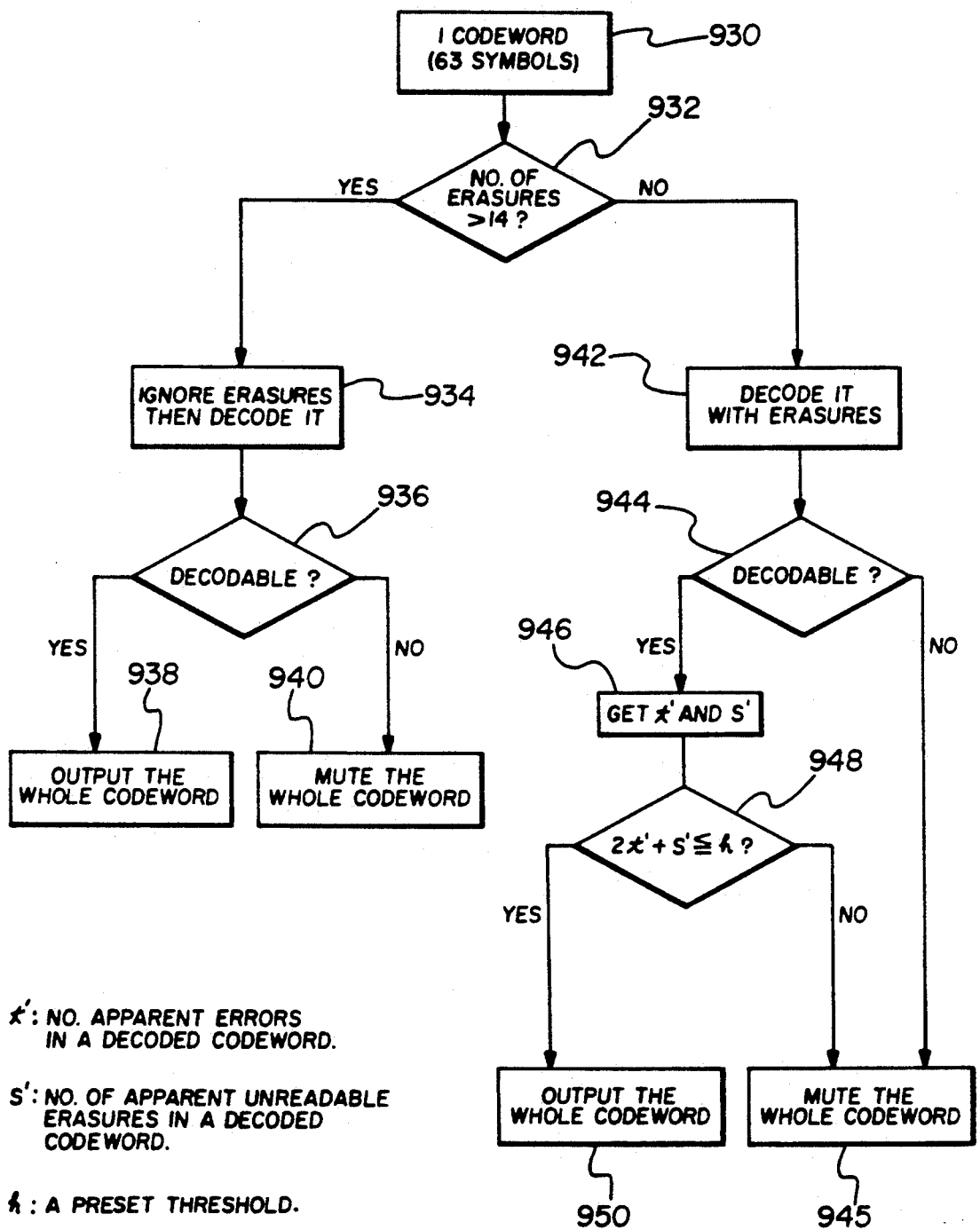
FIG. 21 is a flow diagram illustrating the operation of a forward error corrector of the decoder system of FIG. 12.

Referring to FIG. 21, the number S of symbols in the present codeword received from the data desmearer 808 which are accompanied by erasure flags issued by the PROM 926 of FIG. 20 is determined (block 930). If S is not less than r, rather than disgarding the codeword as undecodable in accordance with conventional techniques, the forward error corrector 816 instead first assumes that some of the erasure flags were erroneously issued and therefore tries to decode the codeword as if there were no erasures (block 934). If it finds the codeword is decodable (block 936), it outputs the decoded/-corrected codeword (block 938). Otherwise, it issues a mute flag to the user, signifying that the codeword is undecodable (block 940).

On the other hand, if S is less than r, then the forward error corrector 816 decodes the codeword using all of the erasure flags as erasure locations (block 942). If the codeword is not decodable, the forward error corrector 816 issues a codeword mute flag to the user (block 945). If the codeword is decodable (block 944), the forward error corrector 816 determines how many of the 63 codeword symbols accompanied by an erasure flag were error-free. This number is then subtracted from S (the number of apparent erasures, discussed above) to obtain the number of true erasures S' (block 946). Also, the number of erroneous symbols found which were not accompanied by an erasure flag is determined. This number is the number of actual errors t'. A more rigorous test is now applied by demanding that $S'+2t'$ not exceed h (block 948). If the test is met, the decoded/corrected codeword is transmitted to the user (block 950). Otherwise, the mute flag is transmitted (block 945).

Figure 22:
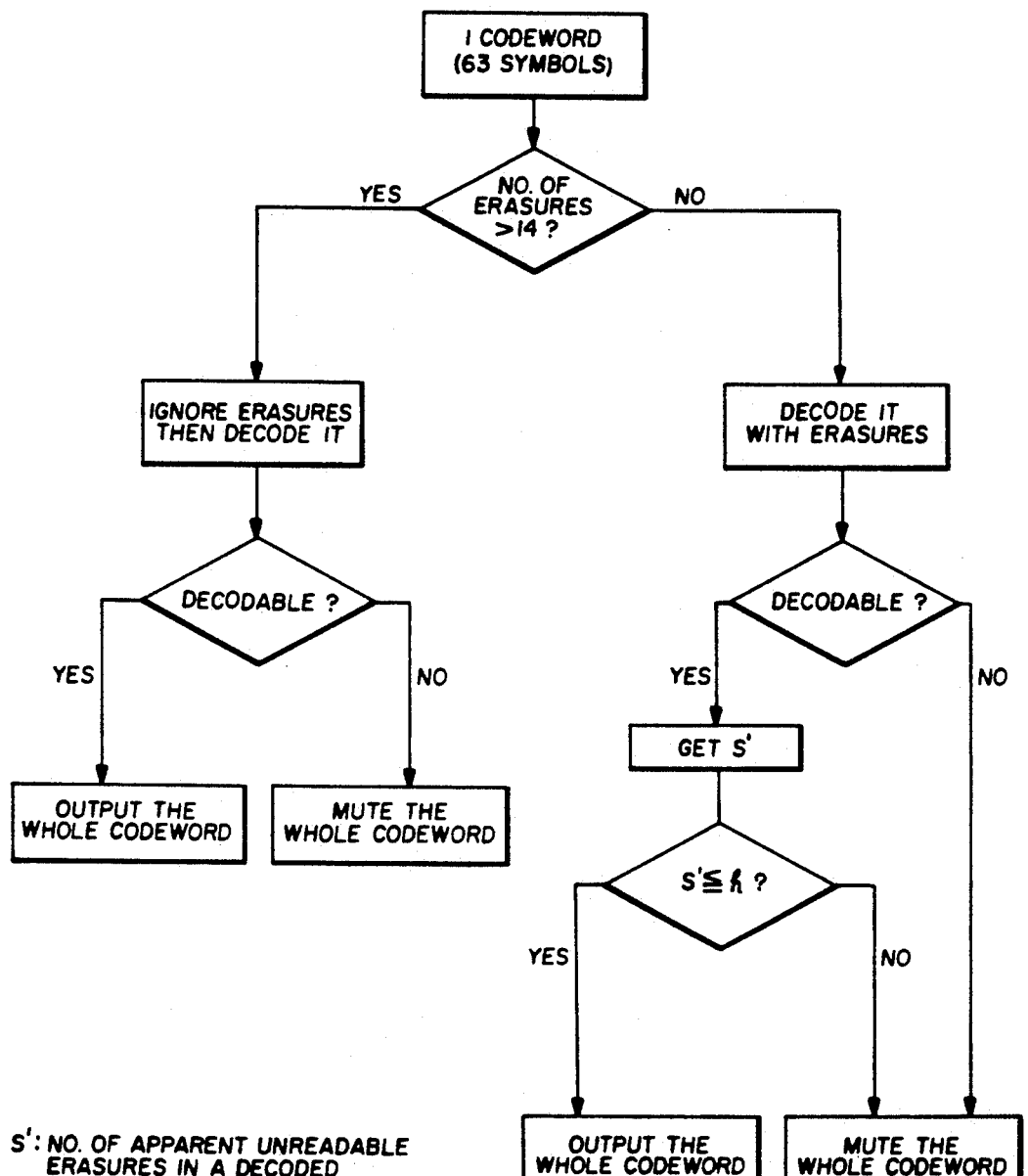
FIG. 22 is a flow diagram illustrating an alternative embodiment of the operation of the forward error corrector of the decoder system of FIG. 12.

An alternative embodiment of the foregoing process is illustrated in FIG. 22, the basic difference being that there are no errors in the process of FIG. 22.

While the invention has been described in detail by specific reference to preferred embodiments thereof, it is understood that variations and modifications thereof may be made without departing from the true spirit and scope of the invention.

What is claimed is:

1. An encoding system characterized by:
   1) block encoding means for encoding a block of input data bits to produce a codeword comprising plural code symbols in accordance with an error correction code;
   2) means for producing a group of codewords of said code comprising said codeword and related codewords, respective ones of said related codewords differing from said codeword by a uniform change to respective sets of symbols of said codeword; and
   3) means for arranging the code symbols of a selected codeword of said group, wherein the selected codeword corresponds to a maximal number of bit differences from previously arranged codewords in a preselected pattern.
2. The encoding system according to claim 1, wherein the error correction code comprises a Reed-Solomon code comprising a palindromic generator polynomial.

* * * * *